(12) United States Patent
Allen et al.

(10) Patent No.: US 9,111,935 B2
(45) Date of Patent: Aug. 18, 2015

(54) MULTIPLE-PATTERNED SEMICONDUCTOR DEVICE CHANNELS

(71) Applicant: International Business Machines Corporation, Armonk, NY (US)

(72) Inventors: David H. Allen, Rochester, MN (US); Douglas M Dewanz, Rochester, MN (US); David P. Paulsen, Dodge Center, MN (US); John E. Sheets, II, Zumbrota, MN (US); Kelly L. Williams, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/795,890

(22) Filed: Mar. 12, 2013

(65) Prior Publication Data

US 2014/0264943 A1    Sep. 18, 2014

(51) Int. Cl.
*H01L 23/528*    (2006.01)
*H01L 21/768*    (2006.01)
*H01L 23/532*    (2006.01)

(52) U.S. Cl.
CPC ...... *H01L 23/5283* (2013.01); *H01L 21/76877* (2013.01); *H01L 23/53295* (2013.01); *H01L 2924/0002* (2013.01)

(58) Field of Classification Search
CPC .................. H01L 21/76229; H01L 21/76802; H01L 21/76805; H01L 21/76816; H01L 21/76831; H01L 21/76832; H01L 21/76834; H01L 21/76835; H01L 21/76897; H01L 21/823475; H01L 23/485; H01L 23/528; H01L 23/5283; H01L 21/76877; H01L 23/53295; H01L 23/5329

USPC .......... 438/595, 620, 622, 637–639; 257/508, 257/E21.548, 758, 760, 775
See application file for complete search history.

(56) References Cited

U.S. PATENT DOCUMENTS 5,663,677 A    9/1997  Freyman et al.
5,726,499 A *  3/1998  Irinoda ........................ 257/774
(Continued)

FOREIGN PATENT DOCUMENTS

CN    101673311 A    3/2010
CN    201910624 U    7/2011
KR   1020110002749 A    1/2011

OTHER PUBLICATIONS

Jae-seok Yang; Pan, D.Z., "Overlay aware interconnect and timing variation modeling for Double Patterning Technology," Nov. 10-13, 2008, IEEE/ACM International Conference on Computer-Aided Design, ICCAD 2008, pp. 488-493.*

(Continued)

*Primary Examiner* — Khiem D Nguyen
*Assistant Examiner* — Pauline Vu
(74) *Attorney, Agent, or Firm* — Peter M. Jacobson

(57) ABSTRACT

A semiconductor device and method of manufacture are provided. The semiconductor device may include a multiple-patterned layer which may include multiple channels defined by multiple masks. A width of a first channel may be smaller than a width of a second channel. A conductor in the first channel may have a conductor width substantially equivalent to a conductor width of a conductor in the second channel. A spacer dielectric on a channel side may be included. The method of manufacture includes establishing a signal conductor layer including channels defined masks where a first channel may have a first width smaller than a second width of a second channel, introducing a spacer dielectric on a channel side, introducing a first conductor in the first channel having a first conductor width, and introducing a second conductor in the second channel having a second conductor width substantially equivalent to the first conductor width.

18 Claims, 29 Drawing Sheets

(56) References Cited

U.S. PATENT DOCUMENTS

| | | | |
|---|---|---|---|
| 6,091,154 A * | 7/2000 | Ohkawa | 257/774 |
| 6,407,455 B1 * | 6/2002 | Wald et al. | 257/774 |
| 6,498,069 B1 | 12/2002 | Grivna | |
| 7,268,434 B2 * | 9/2007 | Nakashima | 257/774 |
| 7,648,900 B2 * | 1/2010 | Kirby | 438/612 |
| 8,404,535 B2 | 3/2013 | Yu et al. | |
| 2001/0036734 A1 * | 11/2001 | Gris | 438/689 |
| 2001/0038137 A1 | 11/2001 | Akram | |
| 2001/0054764 A1 * | 12/2001 | Nitta et al. | 257/750 |
| 2001/0055840 A1 | 12/2001 | Verret | |
| 2002/0019100 A1 | 2/2002 | Shukuri et al. | |
| 2002/0039836 A1 | 4/2002 | Venkatesan et al. | |
| 2002/0055230 A1 * | 5/2002 | Chang | 438/258 |
| 2002/0076900 A1 | 6/2002 | Park et al. | |
| 2002/0185684 A1 * | 12/2002 | Campbell et al. | 257/347 |
| 2003/0022422 A1 | 1/2003 | Torii et al. | |
| 2003/0151099 A1 | 8/2003 | Yoshiyama et al. | |
| 2003/0183877 A1 | 10/2003 | Yagishita et al. | |
| 2006/0012052 A1 * | 1/2006 | McDevitt et al. | 257/778 |
| 2006/0097397 A1 | 5/2006 | Russell | |
| 2006/0189137 A1 * | 8/2006 | Anderson et al. | 438/691 |
| 2007/0222082 A1 | 9/2007 | Sonohara et al. | |
| 2007/0264812 A1 * | 11/2007 | Lung | 438/597 |
| 2007/0273044 A1 | 11/2007 | Yang et al. | |
| 2008/0029834 A1 | 2/2008 | Sell | |
| 2008/0283960 A1 * | 11/2008 | Lerner | 257/508 |
| 2010/0301486 A1 * | 12/2010 | Frohberg et al. | 257/770 |
| 2011/0001168 A1 | 1/2011 | Ko et al. | |
| 2011/0014786 A1 * | 1/2011 | Sezginer et al. | 438/618 |
| 2011/0070739 A1 * | 3/2011 | Cheng et al. | 438/705 |
| 2011/0115047 A1 * | 5/2011 | Hebert et al. | 257/508 |
| 2011/0147936 A1 * | 6/2011 | Chu et al. | 257/751 |
| 2011/0217838 A1 * | 9/2011 | Hsieh et al. | 438/618 |
| 2011/0227232 A1 * | 9/2011 | Bonilla et al. | 257/775 |
| 2011/0281410 A1 | 11/2011 | Liu et al. | |
| 2011/0291292 A1 * | 12/2011 | Frohberg et al. | 257/774 |
| 2012/0110521 A1 * | 5/2012 | Agarwal et al. | 716/52 |
| 2012/0161889 A1 | 6/2012 | Ozawa et al. | |
| 2012/0299188 A1 * | 11/2012 | Chen et al. | 257/773 |
| 2013/0003108 A1 * | 1/2013 | Agarwal et al. | 358/1.15 |
| 2013/0007674 A1 * | 1/2013 | Abou Ghaida et al. | 716/52 |
| 2013/0043556 A1 * | 2/2013 | Horak et al. | 257/529 |
| 2013/0061183 A1 * | 3/2013 | Abou Ghaida et al. | 716/52 |
| 2013/0061185 A1 * | 3/2013 | Abou Ghaida et al. | 716/55 |
| 2013/0334610 A1 * | 12/2013 | Moroz et al. | 257/369 |

OTHER PUBLICATIONS

Mirsaeedi, M.; Anis, M., "Overlay-aware interconnect yield modeling in double patterning lithography," Jun. 2-4, 2010, IEEE International Conference on IC Design and Technology (ICICDT), 2010 IEEE International Conference on, pp. 138-141.*

Minoo Mirsaeedi, Mohab Anis, "A statistical yield optimization framework for interconnect in double patterning lithography," Nov. 2011, Microelectronics Journal, vol. 42, Issue 11, pp. 1231-1238.*

Allen et al., "Semiconductor Device Channels", filed Mar. 12, 2013, U.S. Appl. No. 13/795,721.

Allen et al., "Semiconductor Device Channels", filed Mar. 12, 2013, U.S. Appl. No. 13/795,386.

Allen et al.,"Signal Path and Method of Manufacturing a Multiple-Patterned Semiconductor Device", filed Jan. 2, 2013, U.S. Appl. No. 13/732,721.

Sapatnekar, S., et al. "Analysis and Optimization of Power Grids", IEEE, Design & Test of Computers. Published May-Jun. 2003, vol. 20 Issue 3, pp. 7-15, © 2003 IEEE.

Chen, E., "III. Wet and Dry Etching", Apr. 12, 2004. Applied Physics 298r. pp. 1-18.

* cited by examiner

200

Establishing a signal conductor layer having a first channel defined by a first mask and a second channel defined by a second mask, the first channel having a first width and the second channel having a second width, the first width smaller than the second width

210

Introducing a spacer dielectric on a side of the second channel

220

Introducing a first conductor in the first channel having a first conductor width

230

Introducing a second conductor in the second channel having a second conductor width, the first conductor width substantially equivalent to the second conductor width

```
Establishing a double-patterned
signal conductor layer
310
          │
          ▼
Determining widths. Calculating
difference.
320
          │
          ▼
Introducing a dielectric material
330
          │
          ▼
Introducing a photoresist
material
340
          │
          ▼
Exposing at least a portion of at
least one of the dielectric
material and the photoresist
material
350
          │
          ▼
Removing a portion of the
dielectric material
360
          │
          ▼
Removing the photoresist
material
370
          │
          ▼
Introducing a conductive
material
380
```

Establishing (defining and etching) a double-patterned signal conductor layer
401

Determining widths. Calculating difference.
402

Introducing (blanket depositing) a dielectric material
403

Introducing (applying) a photoresist material
404

Exposing the photoresist material and the dielectric material of that may not contain a spacer by applying a mask
405

Removing (wet etching) exposed dielectric material (trenches not to be enhanced)
406

Removing the photoresist material
407

Removing (anisotropic etching) dielectric material not existing as a spacer dielectric
408

Introducing (filling trenches with, polishing) a conductive material
409

FIG. 4A

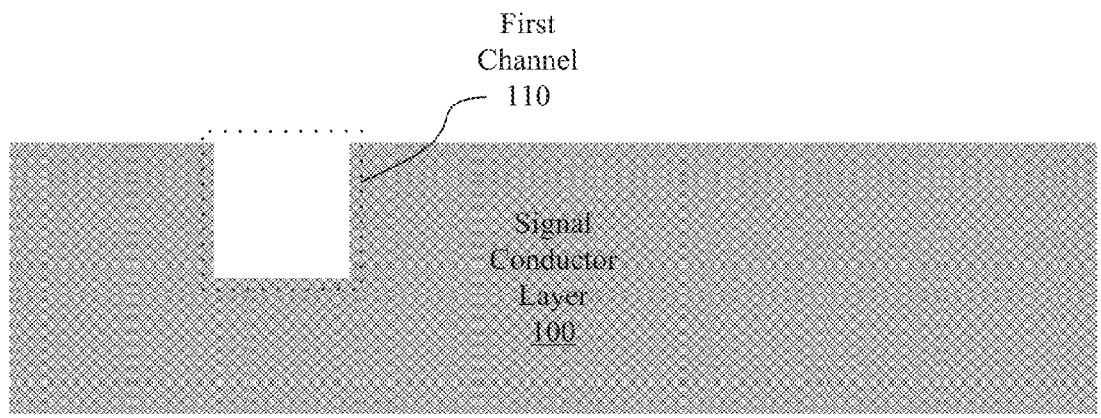
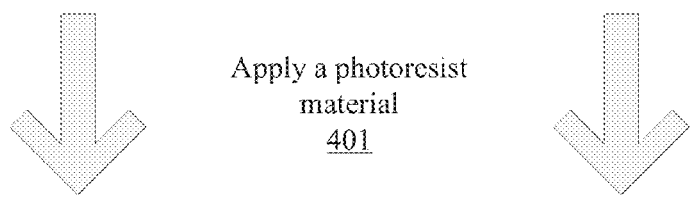
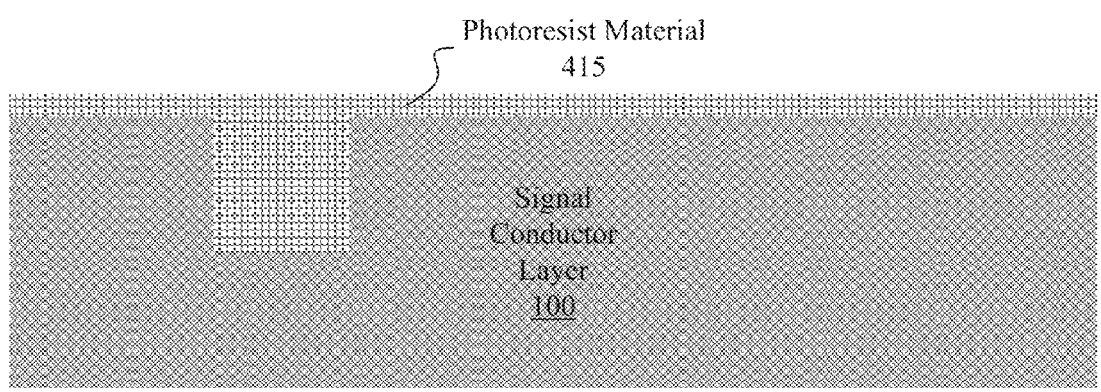
FIG. 4G

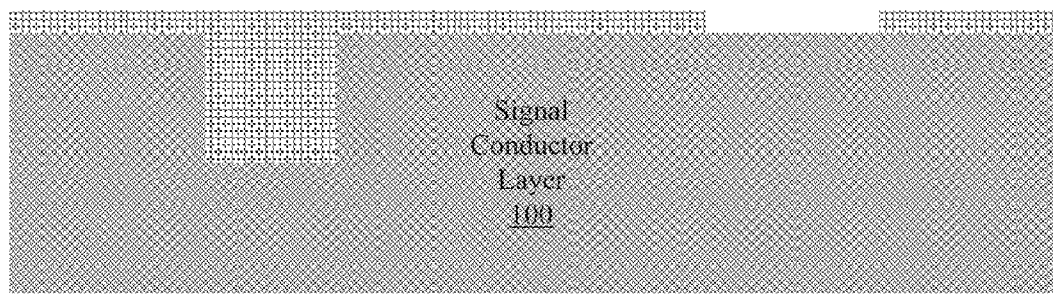
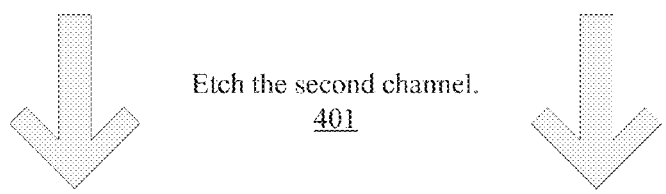
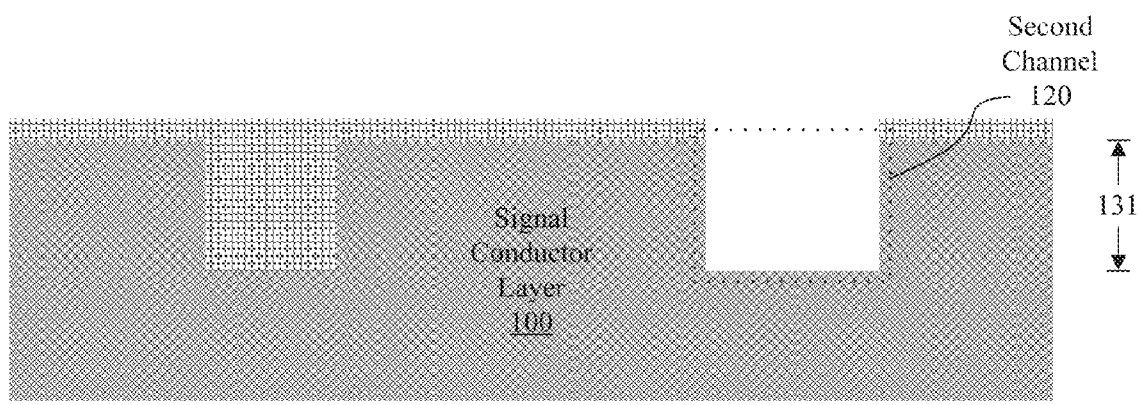
FIG. 4J

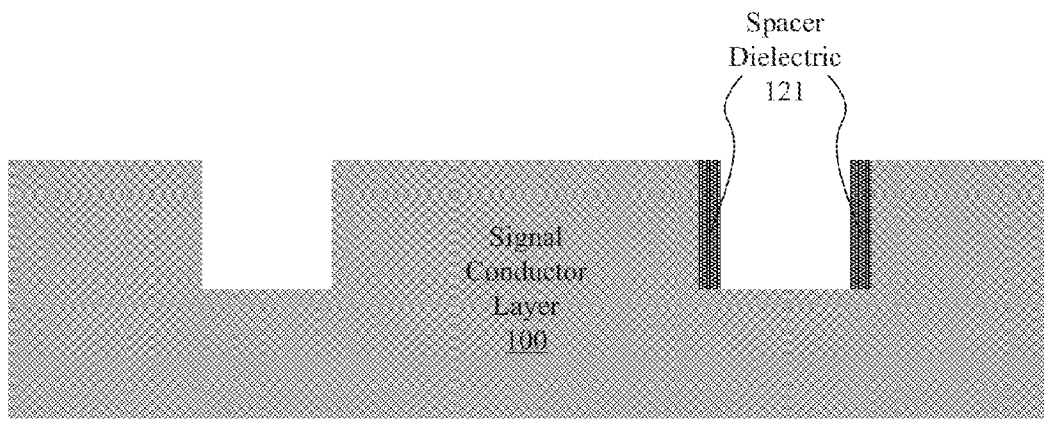
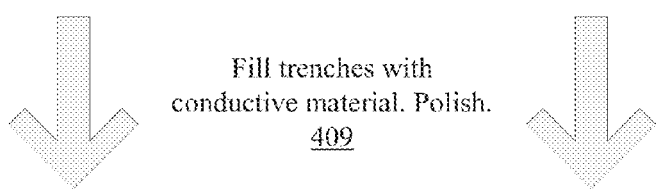
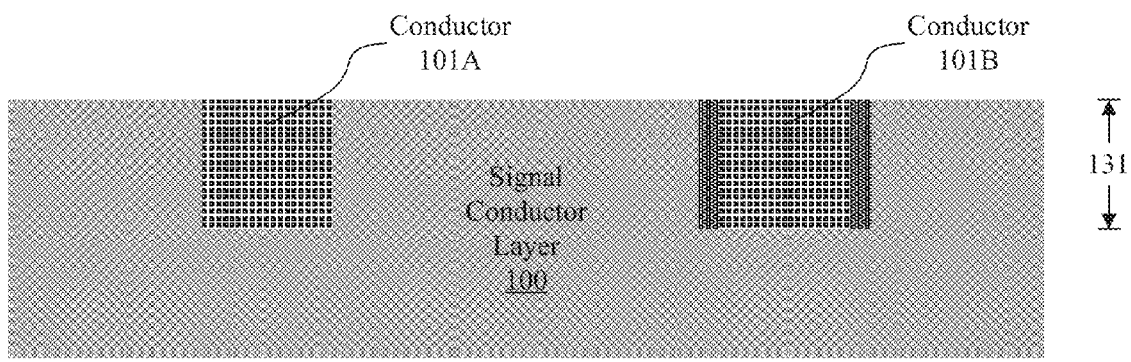
FIG. 4R

500

Establishing (defining and etching) a double-patterned signal conductor layer
501

Determining widths. Calculating difference.
502

Introducing (applying) a photoresist material
503

Exposing the photoresist material of trenches that may contain a spacer by applying a mask
504

Developing. Hardening undeveloped photoresist material
505

Introducing (blanket depositing) a dielectric material
506

Removing (anisotropically etching) dielectric material
507

Removing (plasma ashing) the photoresist material
508

Introducing (filling trenches with, polishing) a conductive material
509

FIG. 5A

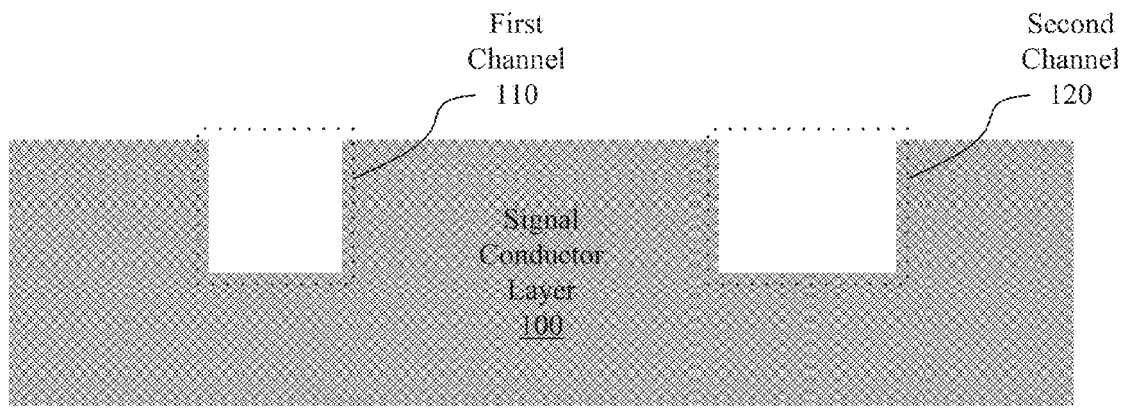
Determine a first width of the first channel and a second width of the second channel. Calculate difference.
502
Apply a photoresist material
503
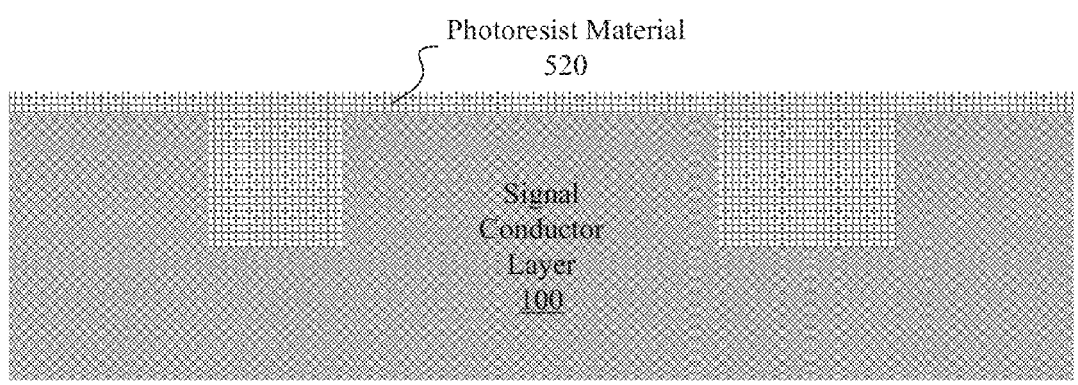
FIG. 5B

MULTIPLE-PATTERNED SEMICONDUCTOR DEVICE CHANNELS

TECHNICAL FIELD

This disclosure relates generally to a semiconductor device and, more particularly, relates to a multiple-patterned semiconductor device.

BACKGROUND

The semiconductor industry is producing more and more capable components with smaller and smaller feature sizes. The production of such semiconductor devices reveals new design and manufacturing challenges to be addressed in order to maintain or improve semiconductor device performance. Simultaneously having semiconductor wiring stacks with high density, high yield, good signal integrity as well as suitable power delivery may present challenges.

As the device density of semiconductors increases, the conductor line width and spacing within the semiconductor devices decreases. Multiple-pattern lithography represents a class of technologies developed for photolithography to enhance the feature density of semiconductor devices. Double-patterning, a subset of multiple-patterning employs multiple masks and photolithographic steps to create a particular level of a semiconductor device. With benefits such as tighter pitches and narrower wires, double-patterning alters relationships between variables related to semiconductor device wiring and wire quality to sustain performance.

SUMMARY

In an embodiment, this disclosure relates to a semiconductor device. The semiconductor device may include one or more layers. The semiconductor device may be multiple-patterned on a particular level. The semiconductor device may include channels. The channels may be defined by masks. In particular, the semiconductor device may include a first channel defined by a first mask and a second channel defined by a second mask. The first channel may have a first width and the second channel may have a second width. The first width may be smaller than the second width. A first conductor in the first channel may have a first conductor width. A second conductor in the second channel may have a second conductor width. The first conductor width may be substantially equivalent to the second conductor width. A spacer dielectric may be introduced on a side of the second channel.

In an embodiment, this disclosure relates to a method of manufacture of a semiconductor device. The method may include multiple-patterning the semiconductor device. The method may include establishing a signal conductor layer including a first channel defined by a first mask and a second channel defined by a second mask. The first channel may have a first width and the second channel may have a second width. The first width may be smaller than the second width. The method may include introducing a spacer dielectric on a side of the second channel. The method may include introducing a first conductor in the first channel having a first conductor width. The method may include introducing a second conductor in the second channel having a second conductor width. The first conductor width may be substantially equivalent to the second conductor width.

BRIEF DESCRIPTION OF THE DRAWINGS

FIG. 2 is a flow chart showing an operation to manufacture a semiconductor device according to an embodiment;

FIG. 3 is a flow chart showing an operation to manufacture a semiconductor device according to an embodiment;

FIG. 4A is a flow chart showing an operation to manufacture a semiconductor device according to an embodiment;

FIG. 4G illustrates applying a photoresist material according to an embodiment.

FIG. 4J illustrates etching a channel according to an embodiment;

FIG. 4R illustrates a conductor filling the trenches according to an embodiment;

FIG. 5A is a flow chart showing an operation to manufacture a semiconductor device according to an embodiment;

FIG. 5B illustrates determining widths, calculating differences, and depositing a dielectric material according to an embodiment;

DETAILED DESCRIPTION

Figure 1:
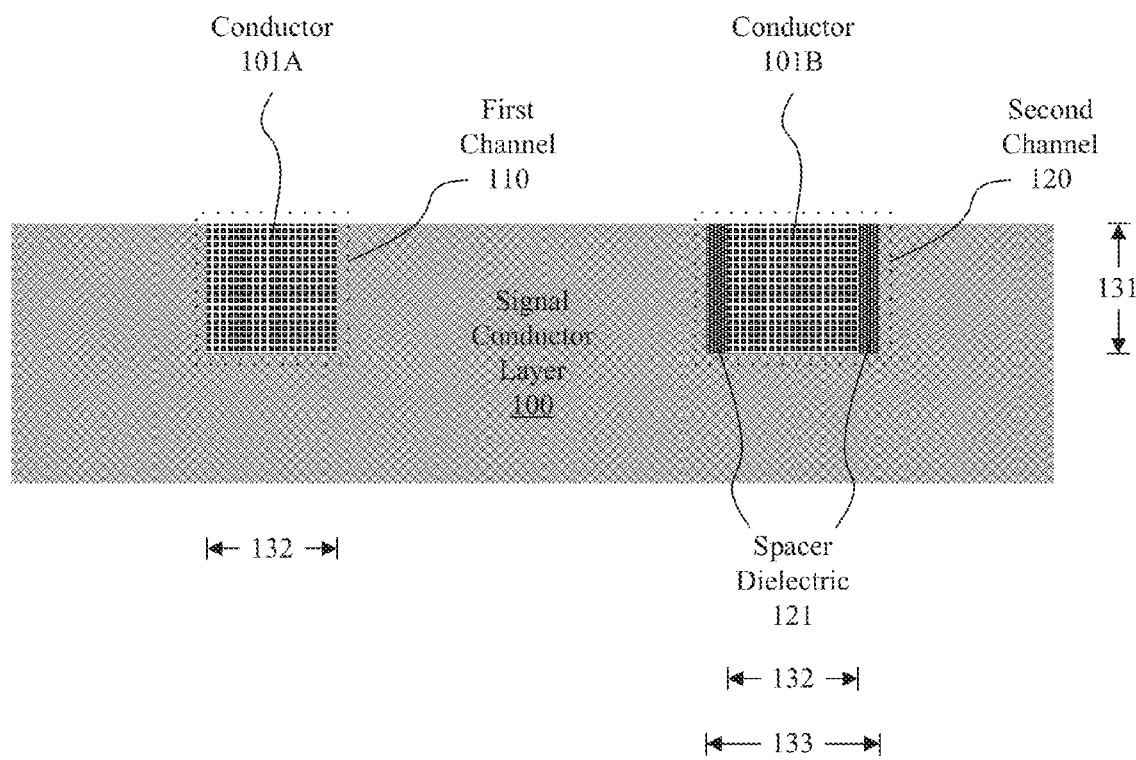
FIG. 1 illustrates a cross-sectional view of a semiconductor device according to an embodiment.

A wiring track on a given plane of a semiconductor device may be designed to lithography and dielectric breakdown specifications. As conductor line width and pitch geometries decrease, the use of double-patterning on a particular level may increase in order to achieve the required conductor dimensions while still using existing state of the art lithographic exposure equipment. A benefit of double-patterning includes the ability to form tight conductor pitches; however, double-patterning may introduce other variables related to timing and noise into the semiconductor process. Double-patterns alter relationships between adjacent wires in both width and spacing. Adjacent wire channels may be defined in separate lithography steps. Distinctions between adjacent wires may arise due to lithographic exposure variations and registration or placement errors of one exposure relative to another. Aspects of the disclosure may limit the implications of such distinctions. Aspects of the disclosure may reduce lateral capacitance and signal coupling on a wiring track adapted to carry a signal.

Single level patterning enables straightforward characterization of parameters with signal delay implications such as wire width, height, and spacing variations. A product of a resistance value (R) of a wire and a capacitance value (C) of the wire forms an RC time constant for the wire (note this is an approximation since the R and the C are distributed along the wire length). Historically, a decrease in wire width or thickness brings about a resistance increase and a corresponding capacitance decrease. The C decrease approximately offsets the R increase in the RC time constant. Such capacitance decrease occurs in part due to a reduction in lateral capacitance because the space between wires increases as wire width decreases. Similarly, an increase in wire width or thickness brings about a resistance decrease approximately offset in the RC time constant by a corresponding capacitance increase. Such a capacitance increase occurs in part due to a rise in lateral capacitance because the space between wires decreases as wire width increases. Thus, in conventional, single-patterned wires the RC time constant remains within appropriate limits of tolerance.

Double-patterning may have different technical characteristics such as lateral capacitance relative to single level patterning. In double-patterning, the width of adjacent wires is rather independent, i.e., track poorly. Wire widths may not track well between adjacent wires created using separate exposures. Relatively narrow wires may be next to or between relatively wide wires. Double-patterning creates varying lateral capacitance between adjacent wires effectively separate from wire resistance variations. The resistance value (R) and the capacitance value (C) may fail to counterbalance each other across process variations. For example, a highly resistive wire may have high R and high C. Thus, the RC time constant between adjacent wires may vary significantly. Wires of one pattern of a double-pattern may carry a signal faster than wires of the other pattern. This may cause signals to reach their respective destinations at different times. Early analysis of a particular 14-15 nm technology indicates a potential doubling of worst case lateral capacitance between adjacent wires, doubling of coupled noise, and increased total wire C by as much as 50%. Such variations may require a solution to mitigate these effects. Adapting the wiring tracks to carry wires of substantially equivalent widths may achieve desirable results related to signal timing.

Aspects of the disclosure may include a signal conductor layer. The signal conductor layer may be a metal layer. The signal conductor layer may include channels which may be established. The channels may be trenches or troughs and may be defined by masks. The masks may be photomasks. The channels may include a first channel and a second channel. The first channel may have a first width. The second channel may have a second width. The first channel may be a result of a first channel pattern. The second channel may be a result of a second channel pattern.

In embodiments, a channel may include a dielectric material which may be introduced. The dielectric material of the channel may be a spacer. Where the dielectric material is not part of one of the channels, the channel may include a conductor which may be introduced. Aspects may include a first conductor in the first channel having a first conductor width. Aspects may include a second conductor in the second channel having a second conductor width. In embodiments, the first conductor width may be substantially equivalent to the second conductor width.

FIG. 1 illustrates a cross-sectional view of a semiconductor device according to an embodiment. The semiconductor device may be double-patterned. The semiconductor device may include a signal conductor layer 100. The signal conductor layer may be a metal layer. The signal conductor layer may include a dielectric material. The signal conductor layer may include an oxide. Particular dielectric materials such as silicon dioxide may be used, though others are considered.

The signal conductor layer 100 may include a channel. A channel may be a trench. The channel may be adapted to hold a wiring track or wire which may be adapted to carry a signal or deliver power. In particular, the signal conductor layer 100 may include a first channel 110. The first channel 110 may be a trench. The first channel 110 may be defined by a first mask. The first channel 110 may be a result of a first channel pattern. The first channel 110 may have a height 131 and a width 132. The first channel 110 may include a conductor 101A. The conductor 101A may have a height 131 and a width 132.

Also, the signal conductor layer 100 may include a second channel 120. The second channel 120 may be a trench. The second channel 120 may be defined by a second mask. The second channel 120 may be a result of a second channel pattern. The second channel 120 may have the height 131 and a width 133. The second channel 120 may include a conductor 101B. The conductor 101B may have the height 131 and the width 132. The width 132 of the conductor 101A of the first channel 110 may be substantially equivalent to the width 132 of the conductor 101B of the second channel 120. A substantially equivalent width may be a measurement of a first width within ten percent of a measurement of a second width. In embodiments, as depicted, the width may be the same. The two conductors, 101A and 101B, may be separately made to have the substantially equivalent width. The two conductors, 101A and 101B, may be designed to have the same width. Process tracking from a mask and an exposure may cause the two conductors, 101A and 101B, to be set to have different widths. In embodiments, aspects described may reduce lateral capacitance. In embodiments, aspects described may reduce signal coupling. In embodiments, aspects described may assist with signal timing.

In embodiments, a wider channel such as the second channel 120 in FIG. 1 may include a spacer dielectric 121. Presence of the spacer dielectric 121 may reduce lateral capacitance, reduce signal coupling, or assist with signal timing. The spacer dielectric 121 may be located on at least one vertical side of the second channel 120. The spacer dielectric 121 may have a permittivity. The permittivity may be a relative permittivity and may be denoted as $\in_r(\omega)$ (sometimes κ or K) and may be defined as $$\varepsilon_r(\omega) = \frac{\varepsilon(\omega)}{\varepsilon_0},$$

where $\in(w)$ is a complex frequency-dependent absolute permittivity of the material, and $\in_0$ is a vacuum permittivity. The permittivity of the spacer dielectric 121 may be less than the permittivity of silicon dioxide which may be 3.9. In embodiments, the spacer dielectric 121 may have a permittivity of 2.3 or a similar permittivity of less than 3.0.

In embodiments, the spacer dielectric has a total width substantially equivalent to a difference of the width 133 of the second channel 120 and the width 132 of the first channel 110. The total width may be a sum of all widths of the spacer dielectric in a channel such as the second channel 120. Capacitive coupling may be influenced by altering a size, such as a width, of the spacer dielectric 121. In embodiments, the spacer dielectric 121 may be as thick as required to make up the capacitive difference between conductors in the channels. In embodiments, the permittivity of the spacer dielectric 121 may correlate with widths involved. In embodiments, the permittivity of the spacer dielectric 121 may be close to that of the signal conductor layer 100. As such, in embodiments, conductor widths and therefore resistance may be substantially equivalent between the channels. In embodiments, the spacer dielectric 121 may not be an equivalent dielectric material to that of the signal conductor layer 100. Other possibilities regarding the spacer dielectric 121 are considered, including using flourine-doped silicon dioxide, using carbon-doped silicon dioxide, placing the spacer dielectric 121 on a bottom surface of the channel, or varying the widths involved.

FIG. 2 is a flow chart showing an operation 200 to manufacture a semiconductor device according to an embodiment. At block 210, operation 200 may include establishing a signal conductor layer having a first channel defined by a first mask and a second channel defined by a second mask. The first channel may have a first width and the second channel may have a second width. The first width may be smaller than the second width. At block 220, operation 200 may include introducing a spacer dielectric on a side of the second channel. At block 230, operation 200 may include introducing a first conductor in the first channel having a first conductor width. At block 240, operation 200 may include introducing a second conductor in the second channel having a second conductor width. The first conductor width may be substantially equivalent to the second conductor width. A substantially equivalent width may be a measurement of a first width within ten percent of a measurement of a second width.

In embodiments, aspects described may reduce lateral capacitance. In embodiments, aspects described may reduce signal coupling. In embodiments, aspects described may assist with signal timing. In addition to the described, other embodiments having fewer steps, more steps, or different steps are contemplated. Also, some embodiments may perform some or all of the steps in FIG. 2 in a different order.

FIG. 3 is a flow chart showing an operation 300 to manufacture a semiconductor device according to an embodiment. At block 310, operation 300 may include establishing a signal conductor layer. The signal conductor layer established at block 310 may be multiple-patterned. For example, the signal conductor layer established at block 310 may be double-patterned. At block 320, operation 300 may include determining widths of channels. Determining widths may include determining a first width of the first channel and determining a second width of the second channel. Calculating a difference in the first width and the second width may also be included at block 320.

At block 330, operation 300 may include introducing a dielectric material. At block 340, operation 300 may include introducing a photoresist material. At block 350, operation 300 may include exposing at least a portion of at least one of the dielectric material and the photoresist material. In embodiments, the exposing may include not underexposing. In embodiments, the exposing may include overexposing where overexposing may include dimensions exposed, time, focus, etc. At block 360, operation 300 may include removing a portion of the dielectric material. Presence of the dielectric material remaining may reduce lateral capacitance, reduce signal coupling, or assist with signal timing. Capacitive coupling may be influenced by altering a size, such as a width, of the dielectric material remaining. At block 370, operation 300 may include removing the photoresist material. At block 380, operation 300 may include introducing a conductive material. In embodiments, a first conductive material width associated with the first trench may be substantially equivalent to a second conductive material width associated with the second trench. Operation 400 of FIG. 4A and operation 500 FIG. 5A may describe operation 300 with further details. In addition to the described, other embodiments having fewer steps, more steps, or different steps are contemplated. Also, some embodiments may perform some or all of the steps in FIG. 3 in a different order.

Figure 4B:
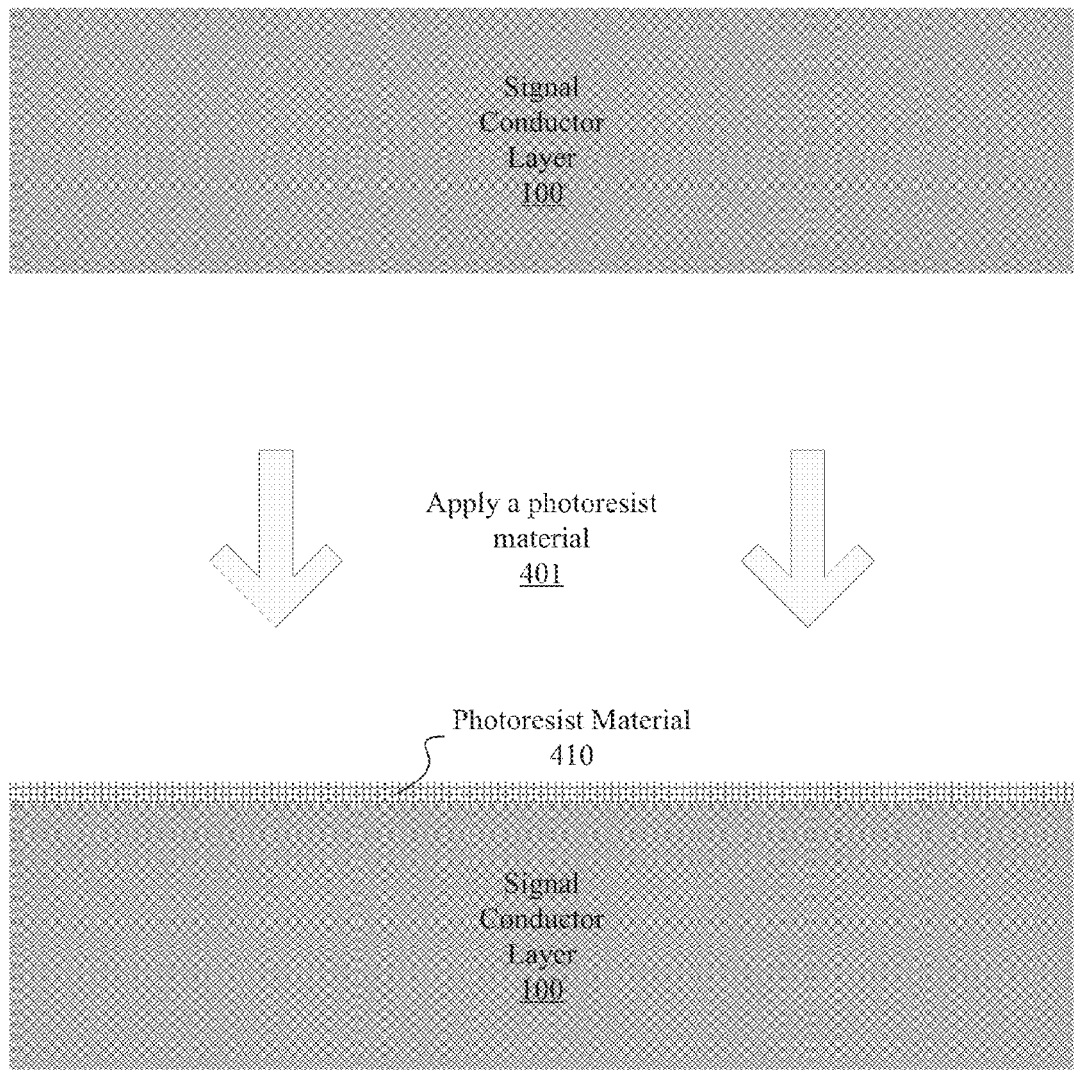
FIG. 4B illustrates applying a photoresist material according to an embodiment.

FIG. 4A is a flow chart showing an operation 400 to manufacture a semiconductor device according to an embodiment. At block 401, operation 400 may include establishing (e.g., defining and etching) a signal conductor layer. The signal conductor layer established at block 401 may be multiple-patterned. For example, the signal conductor layer established at block 401 may be double-patterned. See FIGS. 4B-4K. At block 402, operation 400 may include determining widths of channels. Determining widths may include determining a first width of the first channel and determining a second width of the second channel. Calculating a difference in the first width and the second width may also be included at block 402. At block 403, operation 400 may include introducing (e.g., blanket depositing) a dielectric material. See FIG. 4L.

At block 404, operation 400 may include introducing (e.g., applying) a photoresist material. See FIG. 4M. At block 405, operation 400 may include exposing the photoresist material and the dielectric material of trenches that may not contain a spacer by applying a mask. In embodiments, the exposing may include not underexposing. In embodiments, the exposing may include overexposing where overexposing may include dimensions exposed, time, focus, etc. See FIG. 4N. At block 406, operation 400 may include removing (e.g., wet etching) exposed dielectric material (e.g., trenches that may not contain a spacer). See FIG. 4O. At block 407, operation 400 may include removing the photoresist material. See FIG. 4P. At block 408, operation 400 may include removing (e.g., anisotropic etching) dielectric material not existing as a spacer dielectric. See FIG. 4Q. At block 409, operation 400 may include introducing (e.g., filling trenches with, polishing) a conductive material. See FIG. 4R. In addition to the described, other embodiments having fewer steps, more steps, or different steps are contemplated. Also, some embodiments may perform some or all of the steps in FIG. 4A in a different order.

FIGS. 4B-4R each illustrate a cross-sectional view of a semiconductor device according to an embodiment. FIGS. 4B-4R each illustrate a "before and after" view of operation 400 at each block of FIG. 4A according to an embodiment. Generally, FIGS. 4B-4K illustrate a defining and an etching of the first channel 110 and the second channel 120 in the signal conductor layer 100 which is double-patterned according to an embodiment. The first channel 110 and the second channel 120 may each have the height 131. The first channel 110 may have the width 132. The second channel 120 may have the width 133.

Figure 4C:
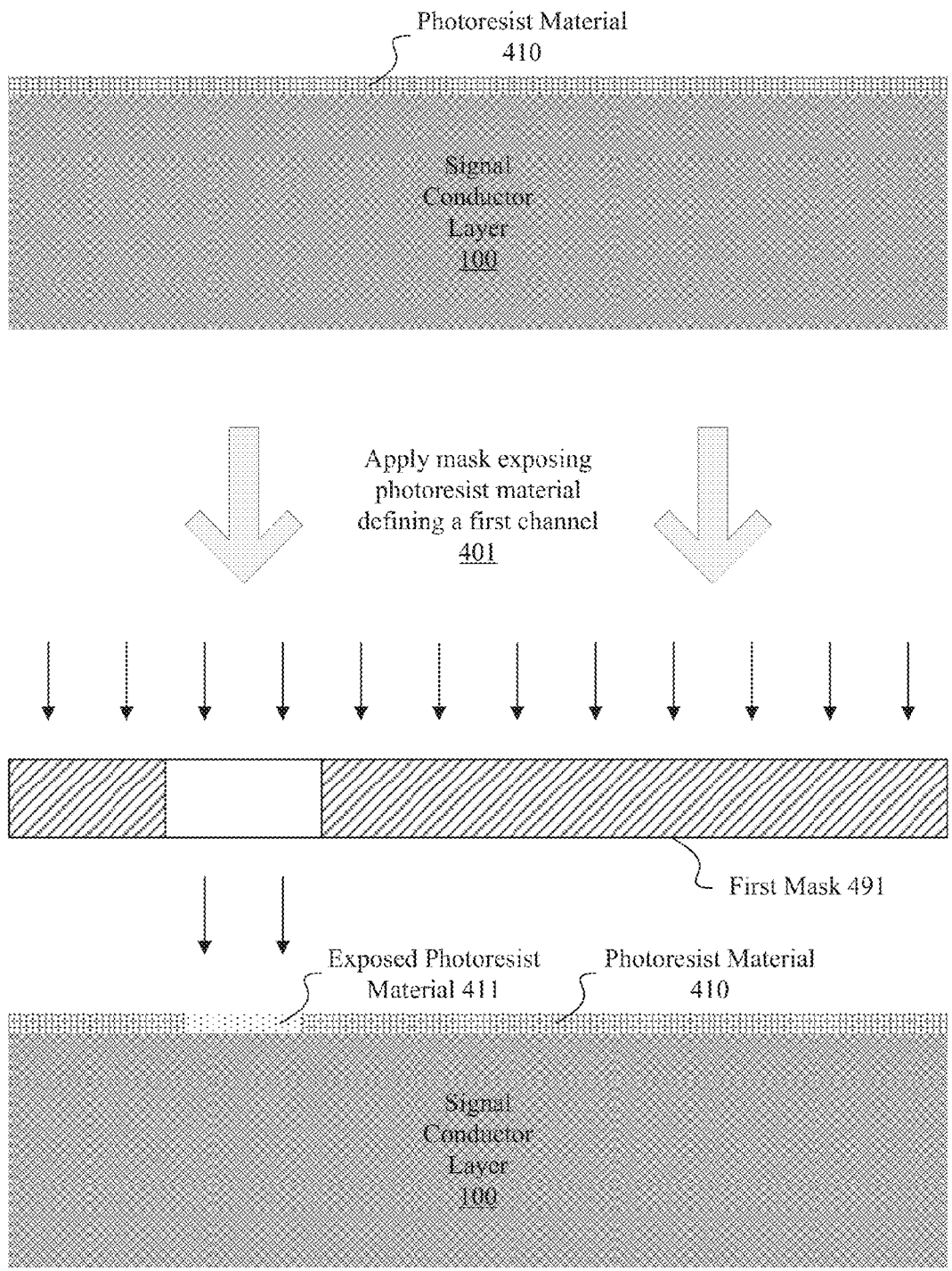
FIG. 4C illustrates applying a mask and exposing photoresist material according to an embodiment.
Figure 4D:
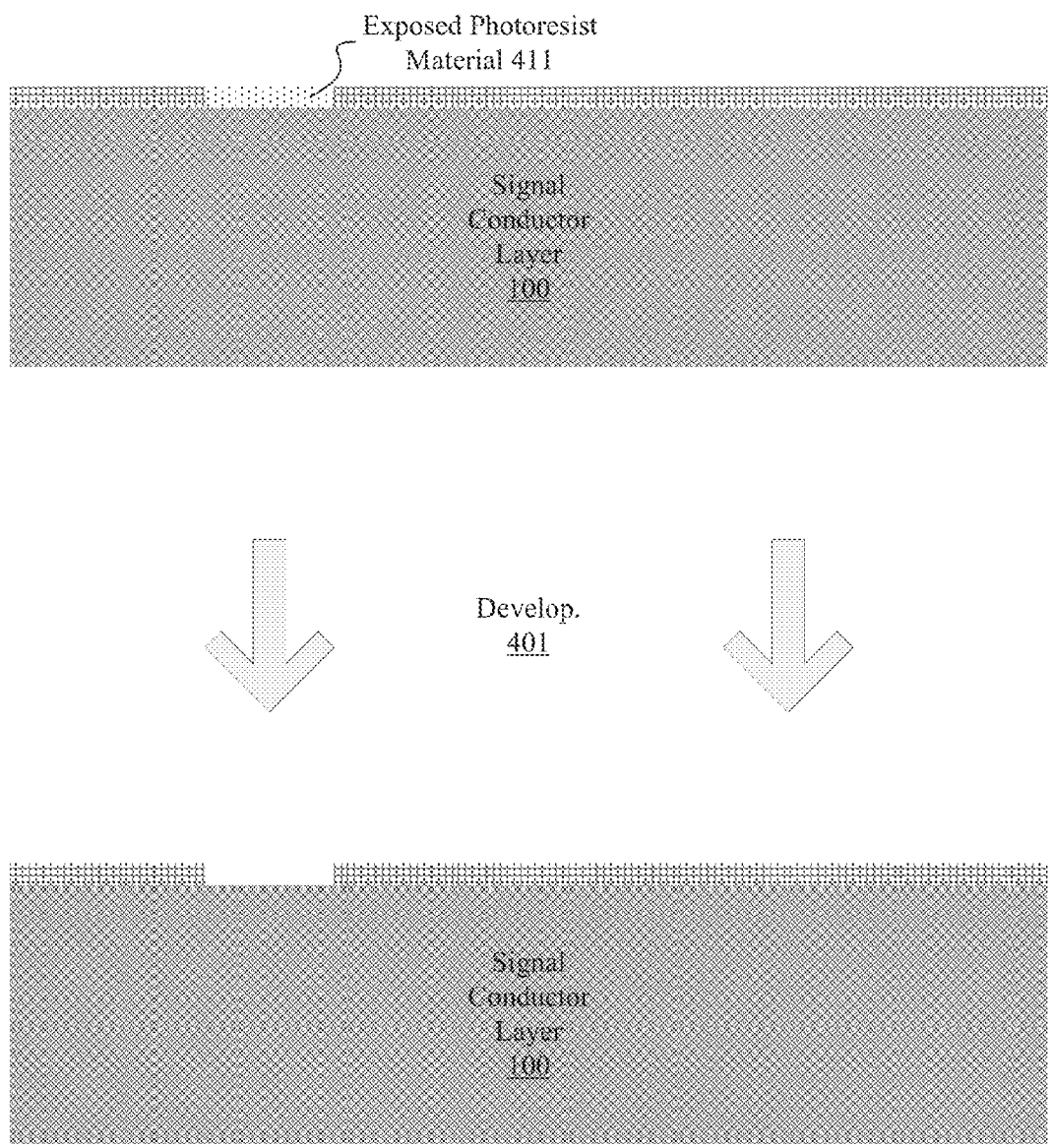
FIG. 4D illustrates developing exposed photoresist material according to an embodiment.
Figure 4E:
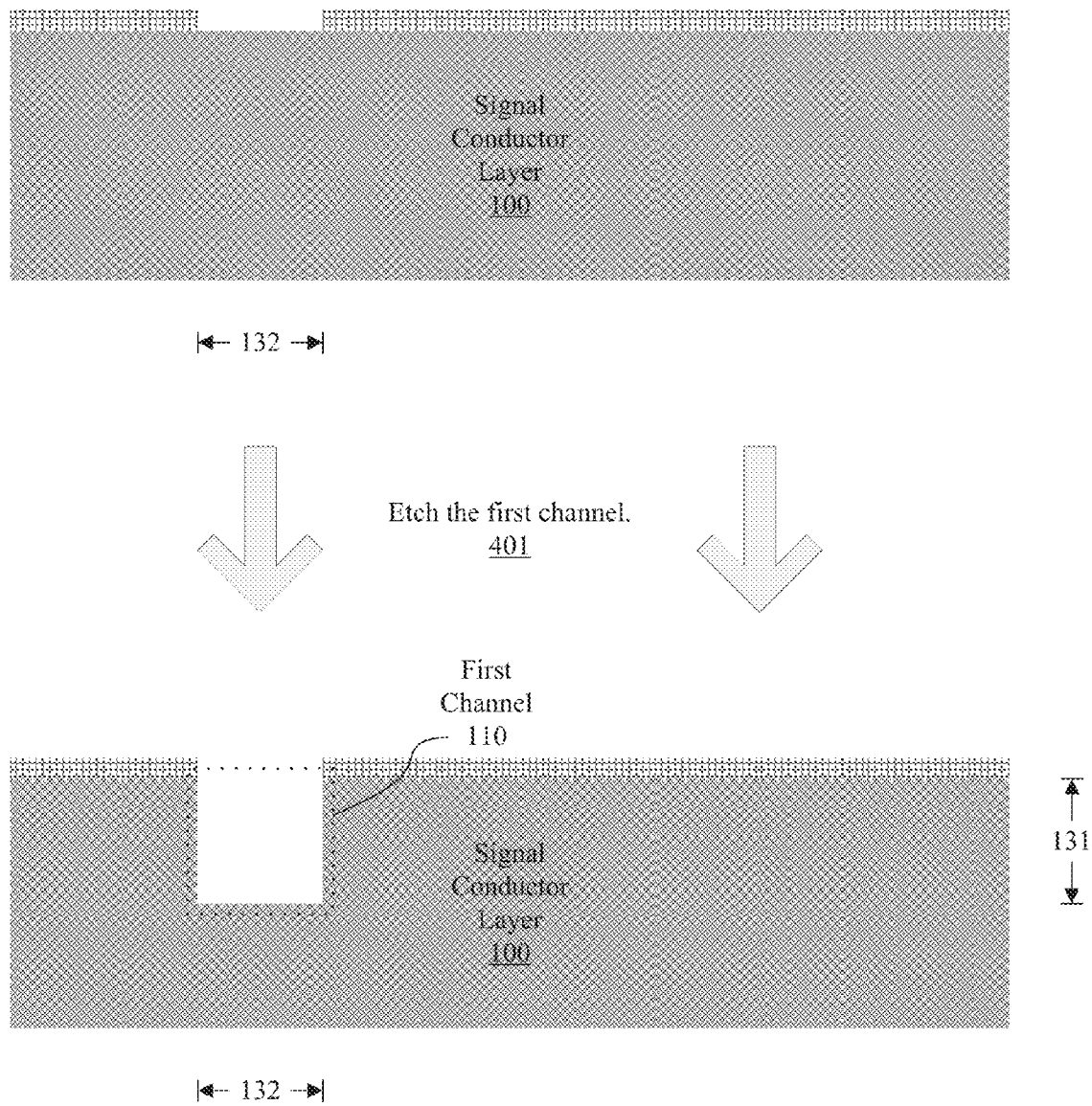
FIG. 4E illustrates etching a channel according to an embodiment.
Figure 4F:
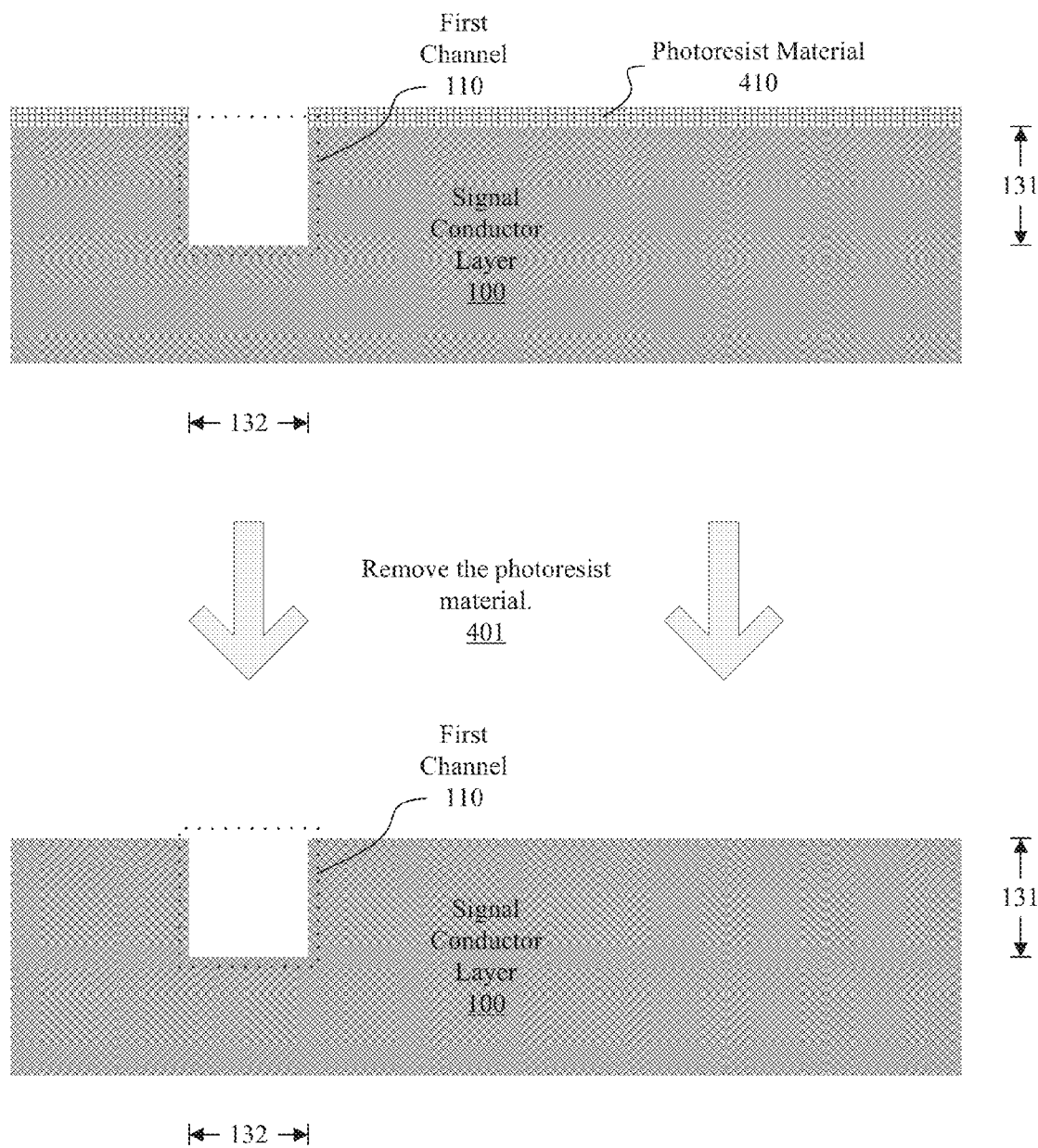
FIG. 4F illustrates removing photoresist material according to an embodiment.

FIG. 4B illustrates applying a photoresist material 410 according to an embodiment. FIG. 4C illustrates applying a first mask 491 to begin defining a first channel with exposed photoresist material 411 according to an embodiment. FIG. 4D illustrates developing the exposed photoresist material 411 according to an embodiment. The width 132 may not be to the exact dimensions of the first mask 491 due to variation in exposure time, focus, etc. FIG. 4E illustrates etching the first channel 110 of the width 132 and a depth or height 131 according to an embodiment. FIG. 4F illustrates removing the photoresist material 410 according to an embodiment.

Figure 4H:
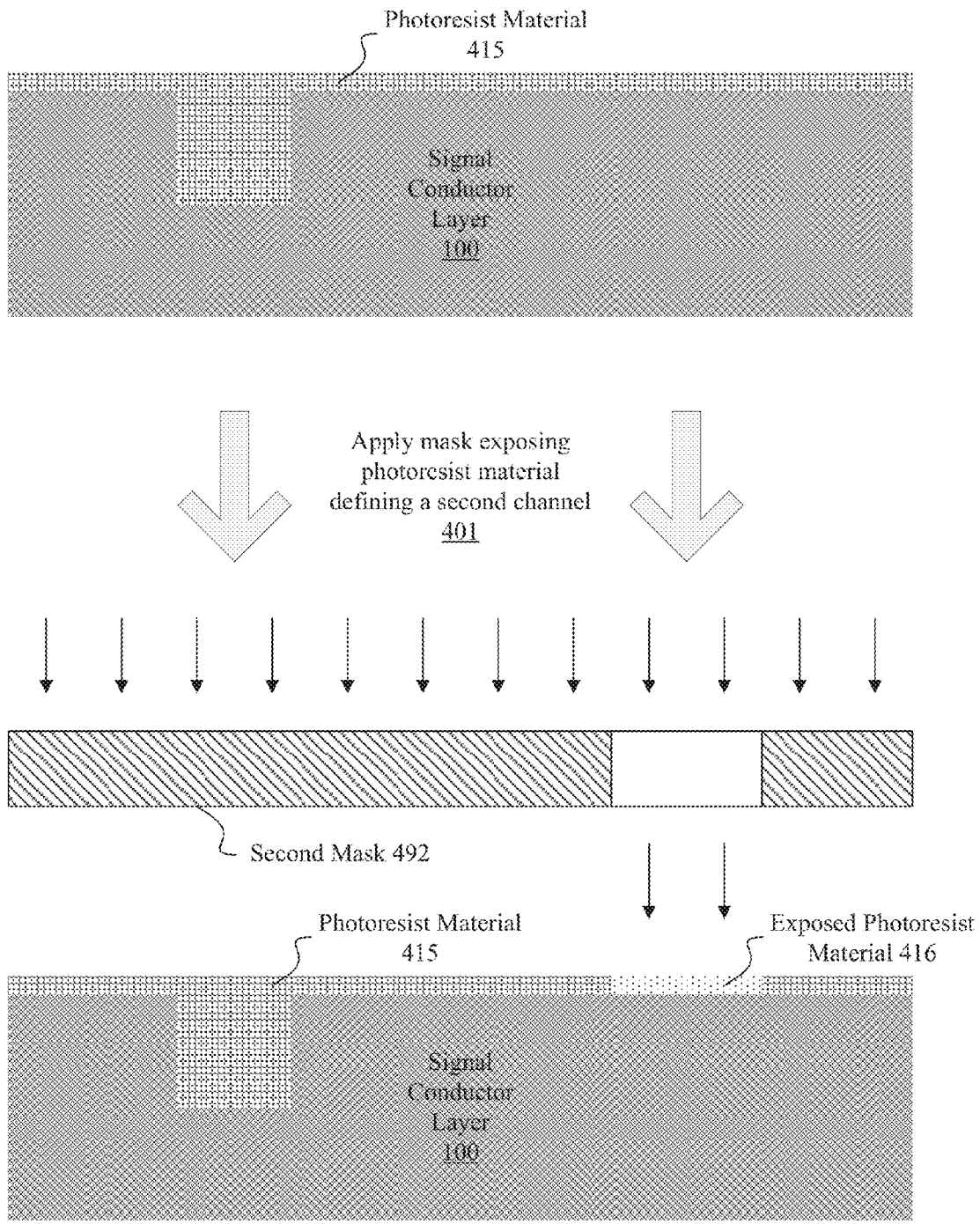
FIG. 4H illustrates applying a mask and exposing photoresist material according to an embodiment.
Figure 4I:
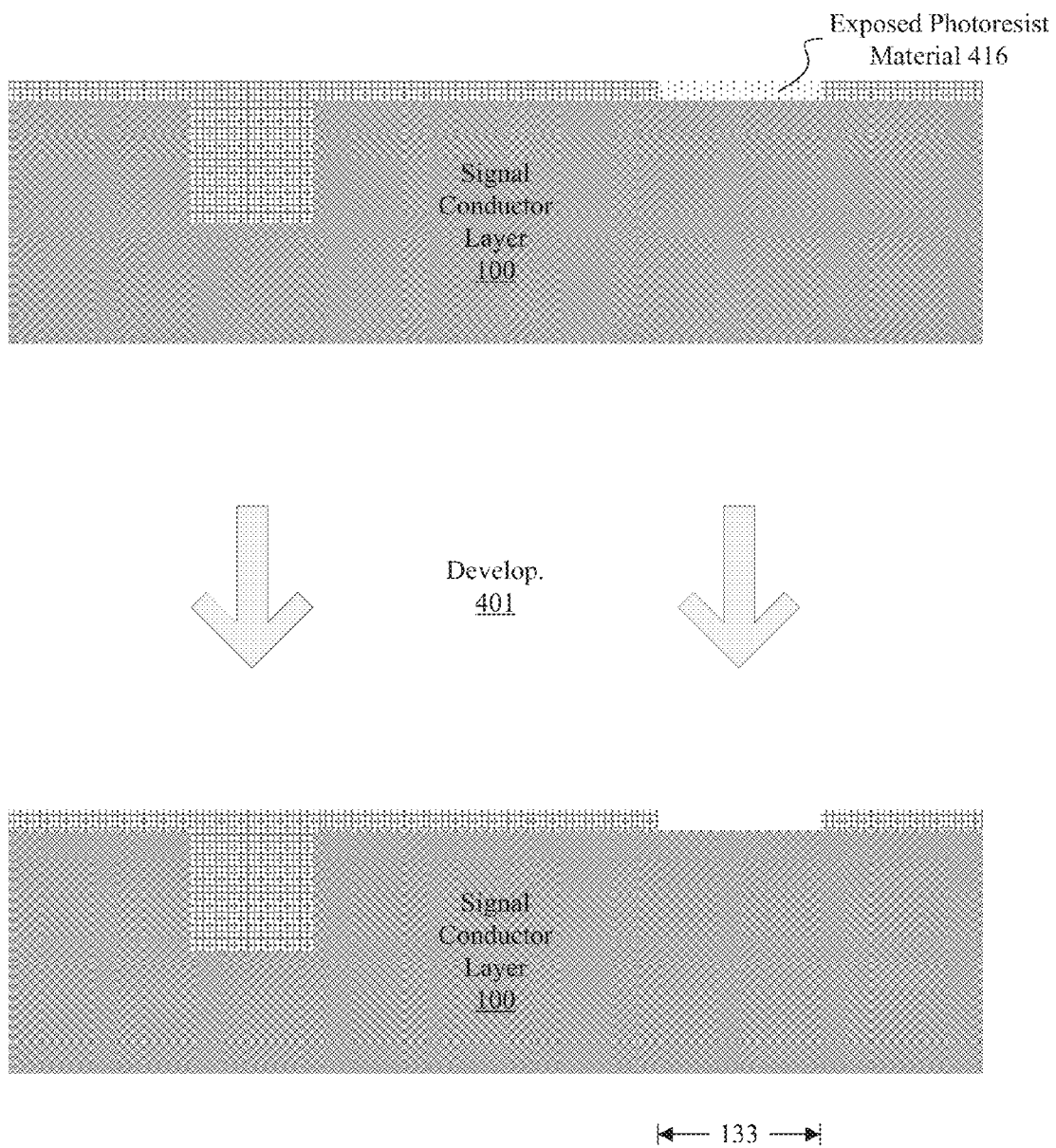
FIG. 4I illustrates developing exposed photoresist material according to an embodiment.
Figure 4K:
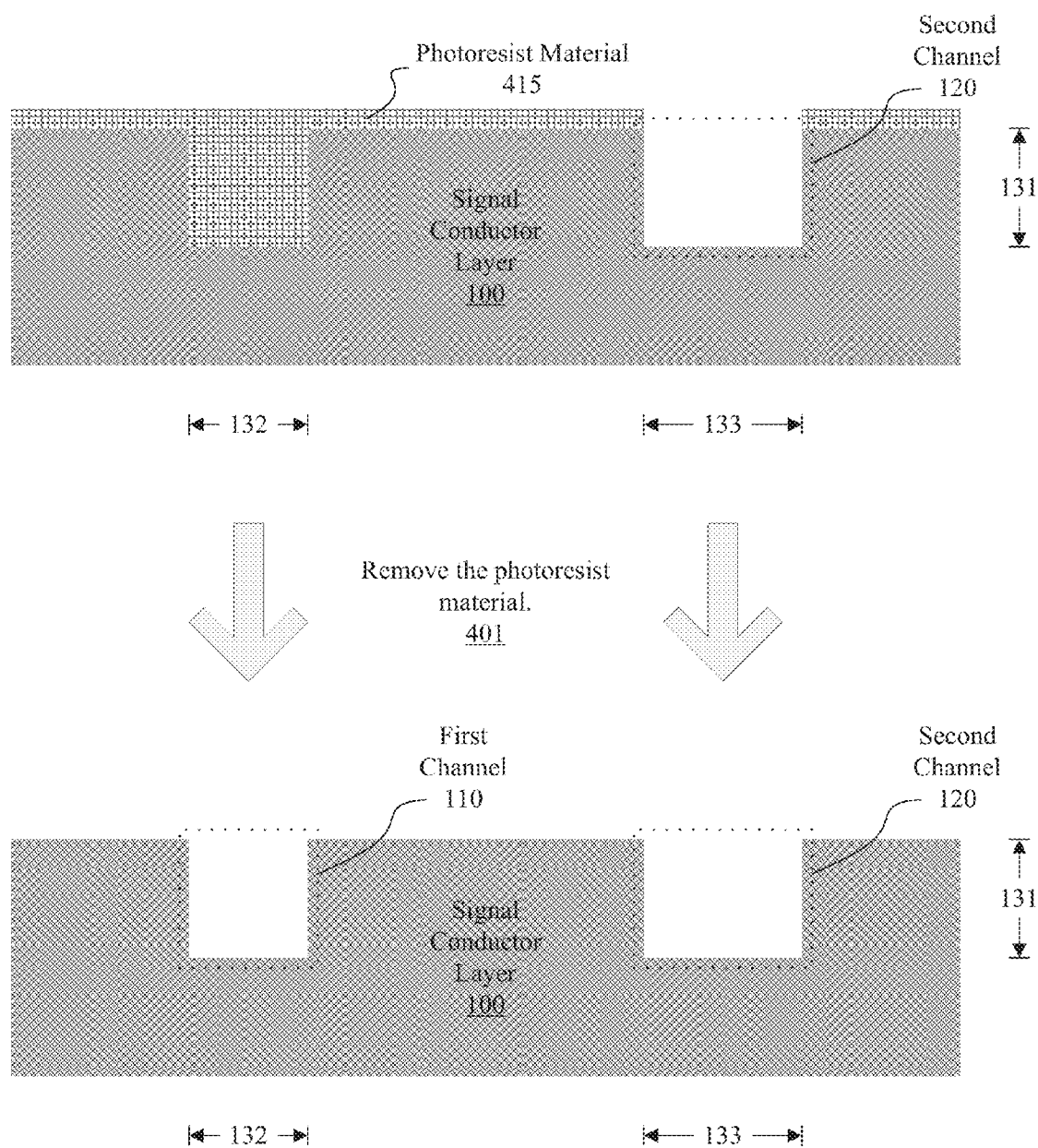
FIG. 4K illustrates removing photoresist material according to an embodiment.

FIG. 4G illustrates applying a photoresist material 415 according to an embodiment. FIG. 4H illustrates applying a second mask 492 to begin defining a second channel with exposed photoresist material 416 according to an embodiment. FIG. 4I illustrates developing the exposed photoresist material 416 according to an embodiment. In embodiments, the width 133 may not be to the exact dimensions of the second mask 492 due to variation in exposure time, focus, etc. In embodiments where the dimensions of the first mask 491 and the second mask 492 are equivalent, the widths 132 and 133 may not be equivalent. FIG. 4J illustrates etching the second channel 120 of the width 133 and a depth or height 131 according to an embodiment. FIG. 4K illustrates removing the photoresist material 415 according to an embodiment. FIGS. 4B-4K may be generally considered an example double-patterning operation, other multiple-patterning operations are considered.

Figure 4L:
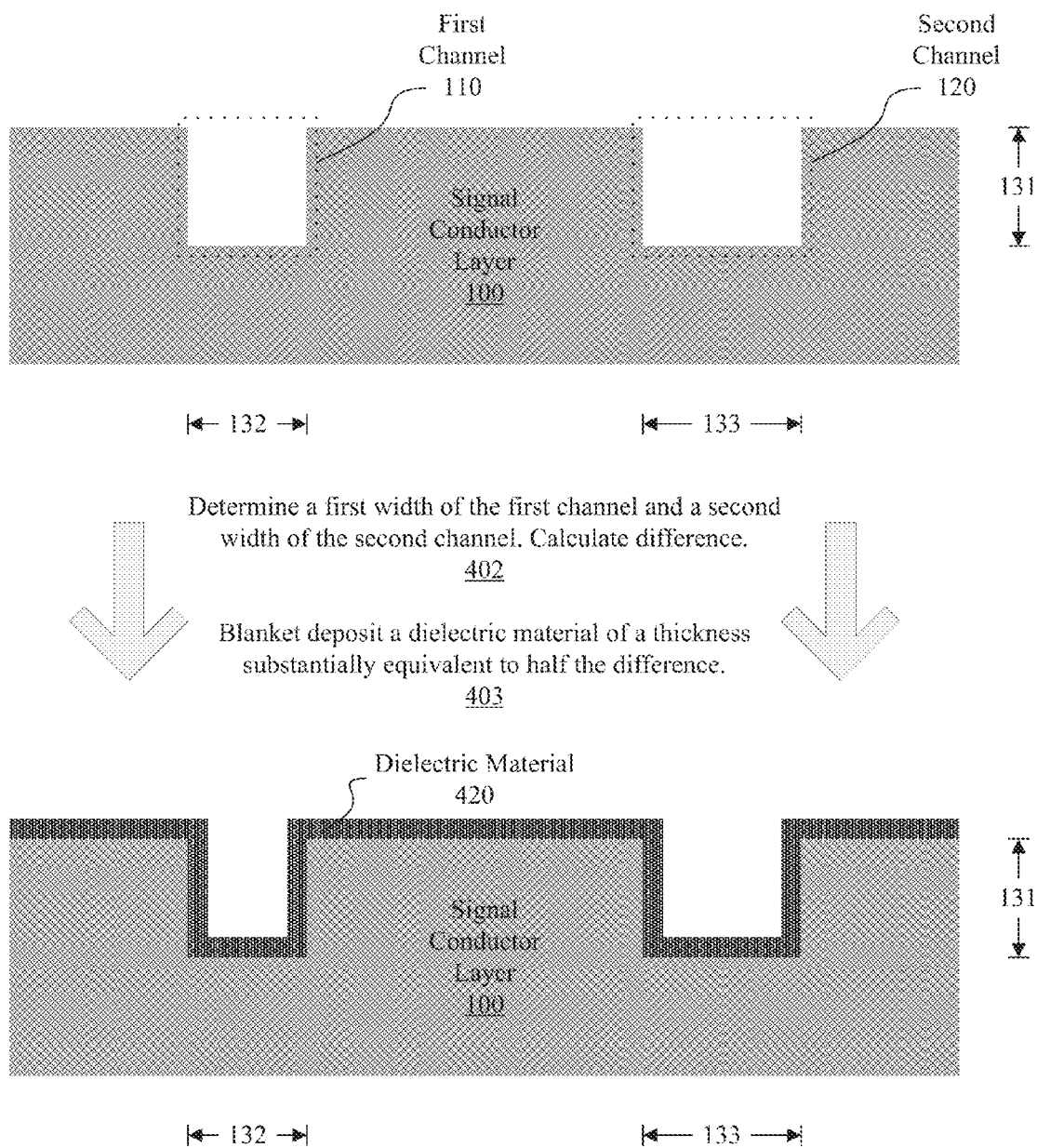
FIG. 4L illustrates determining widths, calculating differences, and depositing a dielectric material according to an embodiment.
Figure 4M:
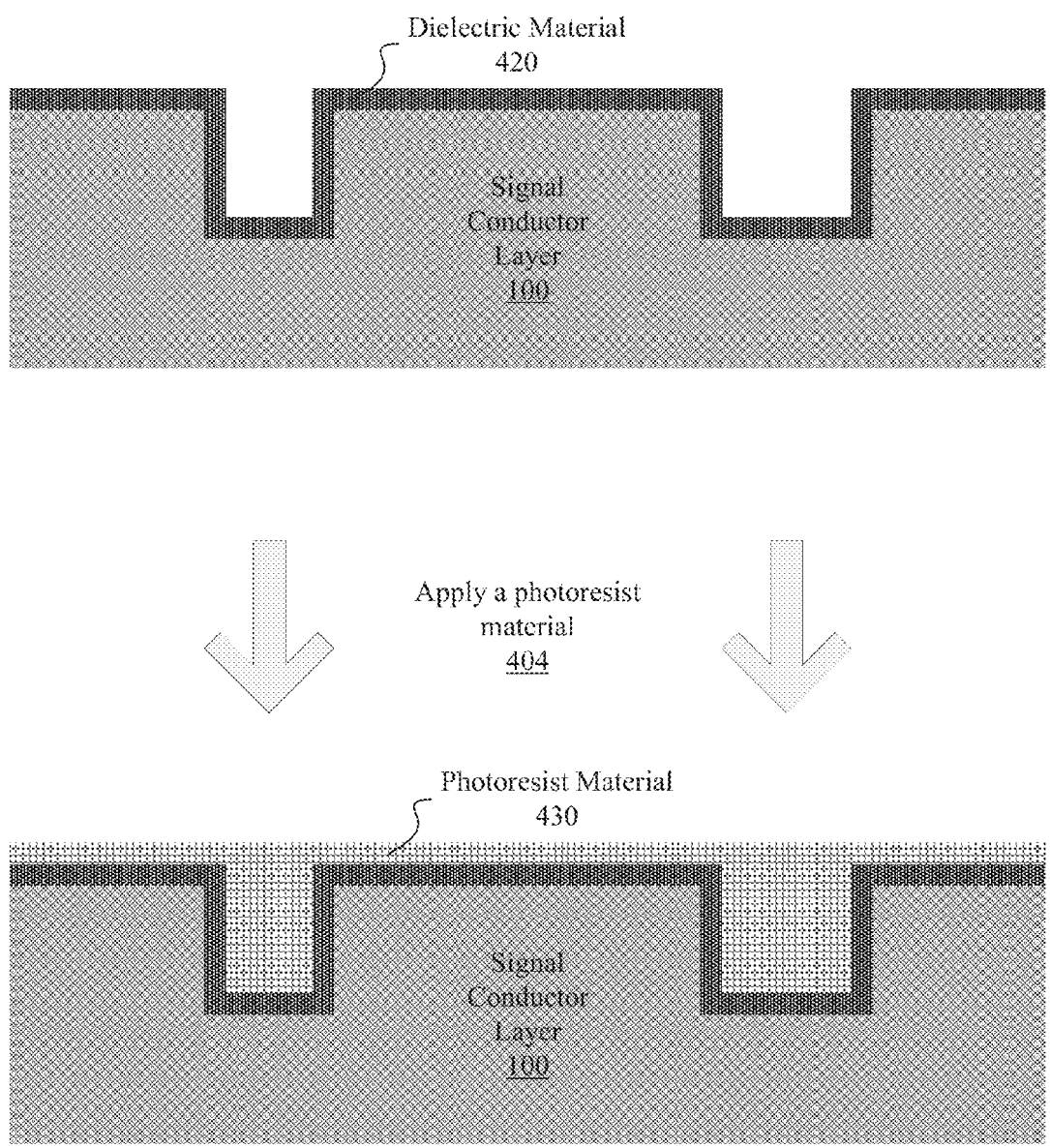
FIG. 4M illustrates an applying of a photoresist material according to an embodiment.
Figure 4N:
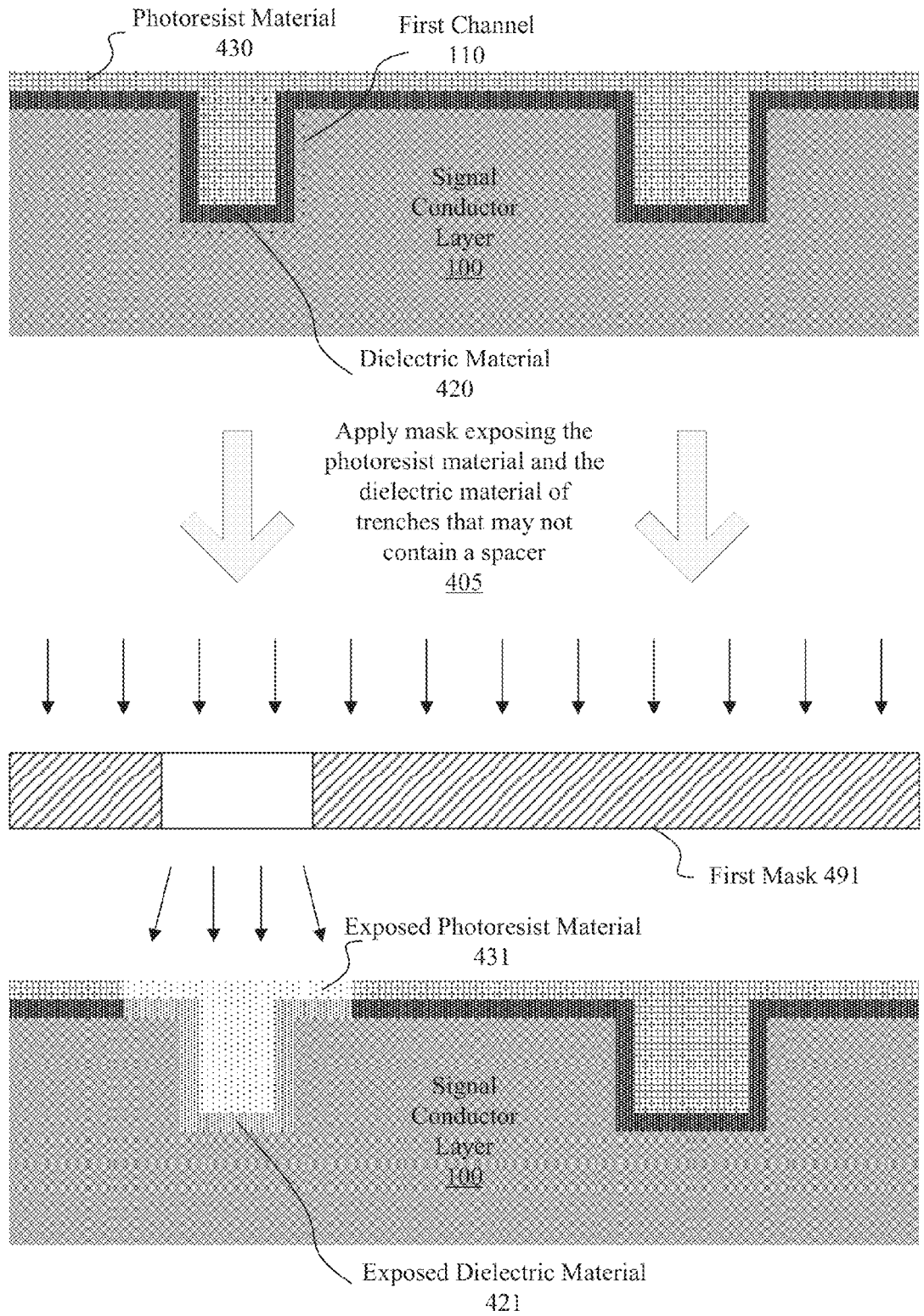
FIG. 4N illustrates an exposing of the photoresist material and the dielectric material according to an embodiment.

FIG. 4L illustrates determining a first width of the first channel and determining a second width of the second channel. A difference in channel widths may be calculated. FIG. 4L further illustrates depositing a dielectric material 420 to the semiconductor device according to an embodiment. In embodiments, the dielectric material 420 may not be an equivalent dielectric material to that of the signal conductor layer 100. The dielectric material deposited may be of a thickness substantially equivalent to half the difference. FIG. 4M illustrates an applying of a photoresist material 430 to the semiconductor device according to an embodiment. FIG. 4N illustrates an exposing of the photoresist material 430 and the dielectric material 420 of the first channel 110 which is a trench that may not contain a spacer. In embodiments, the exposing may include not underexposing. In embodiments, the exposing may include overexposing where overexposing may include dimensions exposed, time, focus, etc. The first mask 491 may be applied during a photolithographic process. After the photolithographic process, exposed photoresist material 431 and exposed dielectric material 421 may remain.

Figure 4O:
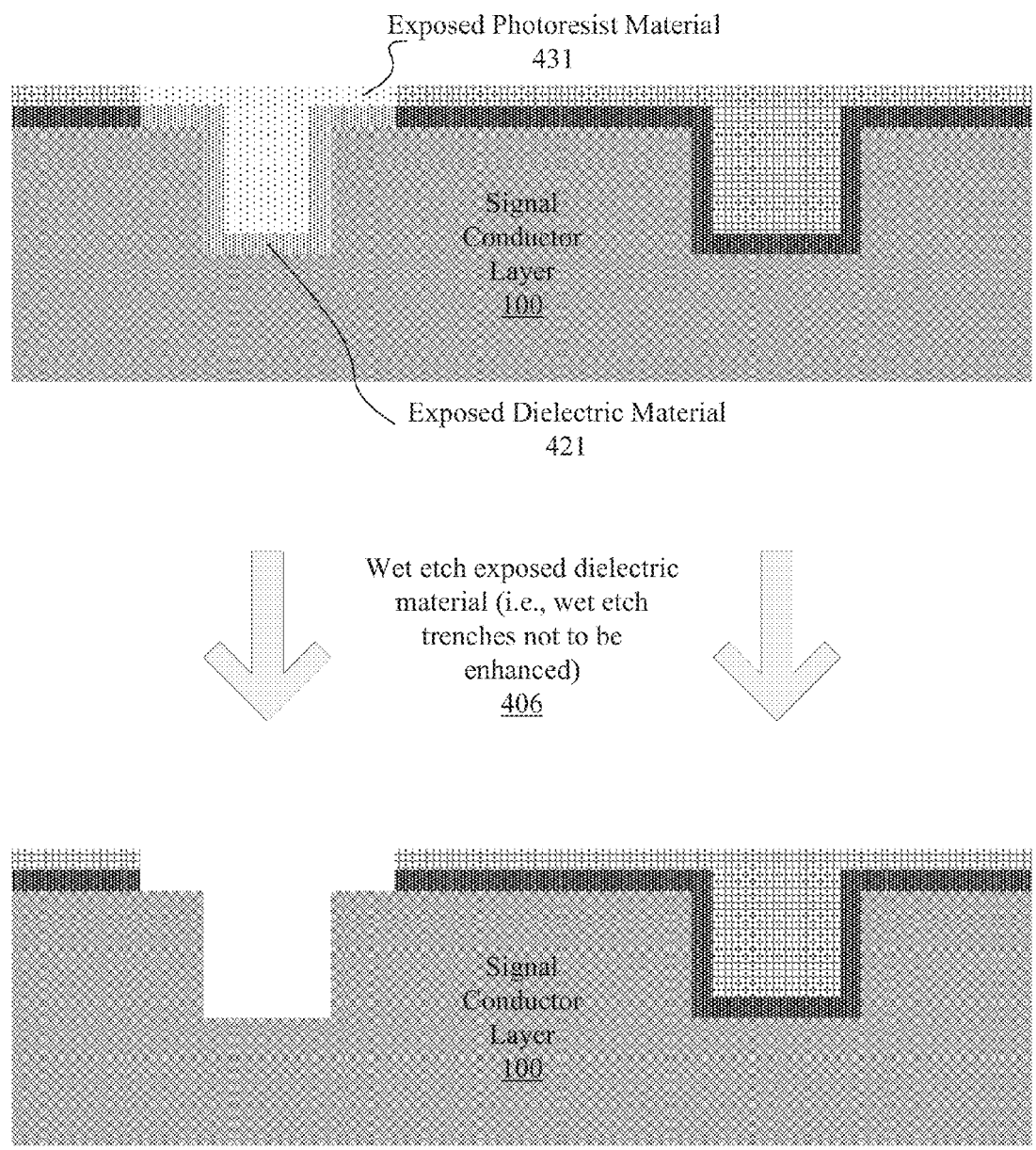
FIG. 4O illustrates a wet etch of the exposed dielectric material according to an embodiment.
Figure 4P:
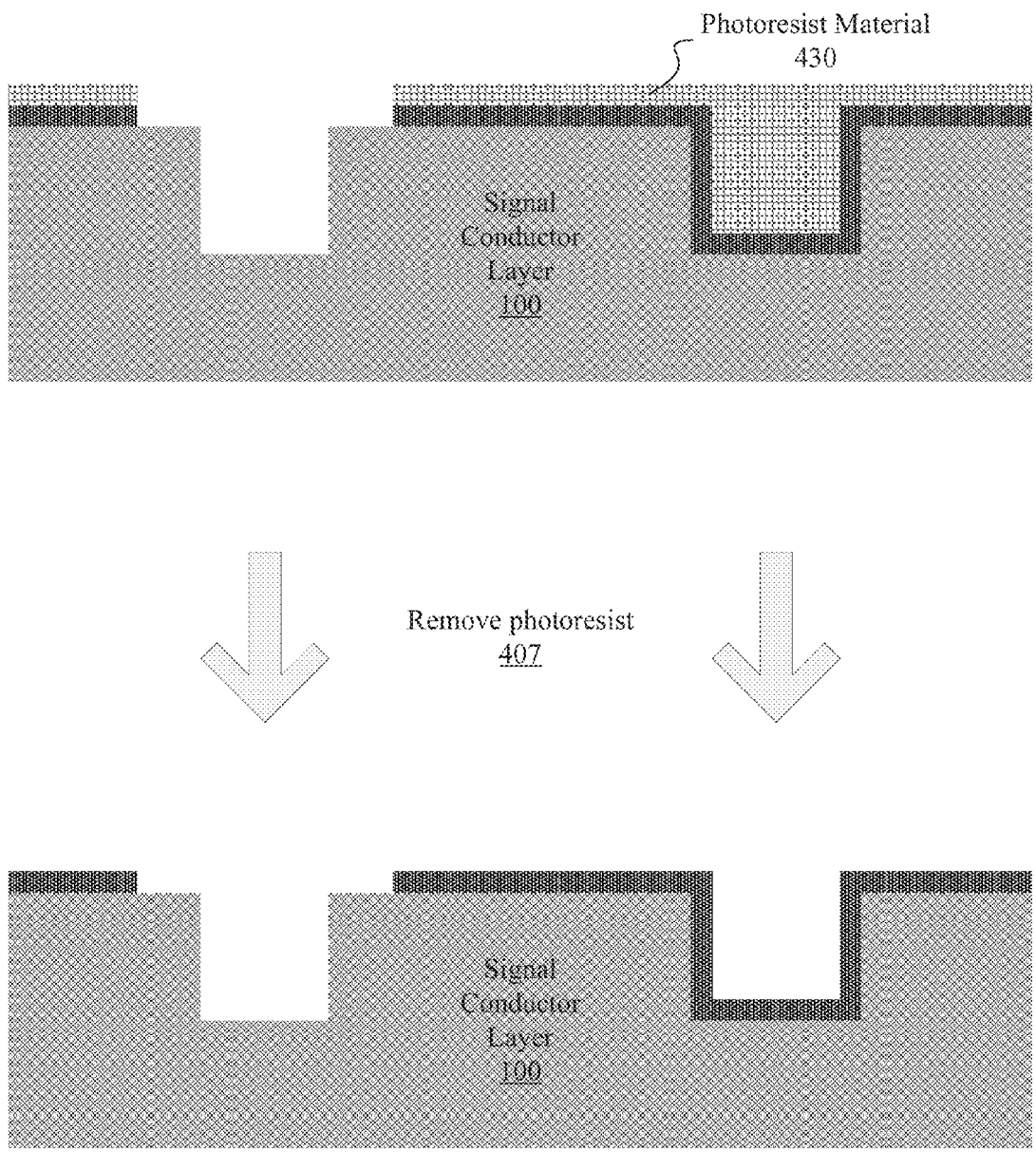
FIG. 4P illustrates a removal of the photoresist material according to an embodiment.
Figure 4Q:
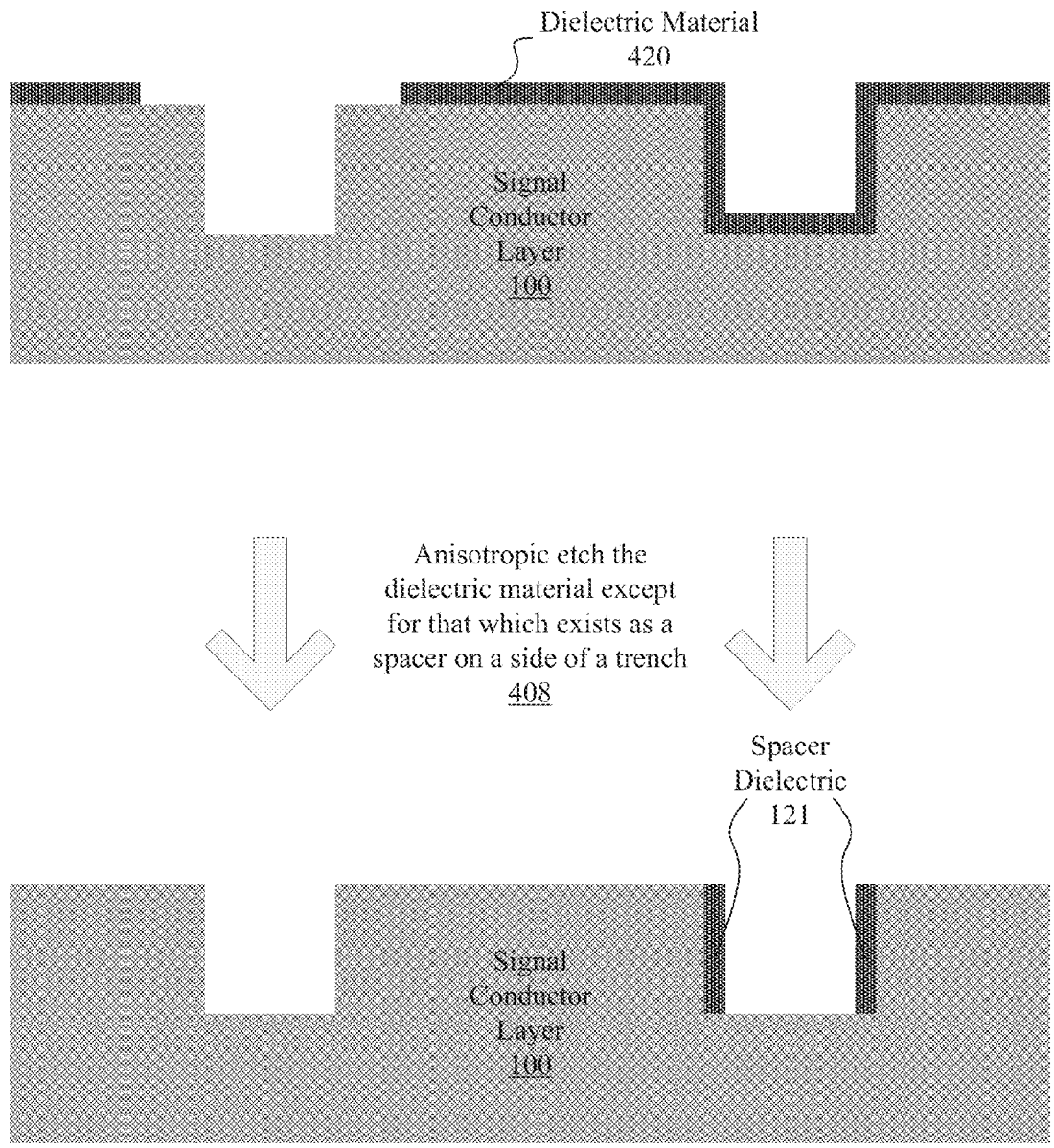
FIG. 4Q illustrates an anisotropic etch of dielectric material according to an embodiment.

FIG. 4O illustrates a wet etch of the exposed dielectric material 421. The exposed photoresist material 431 may also be removed. FIG. 4P illustrates a removal of the photoresist material 430. FIG. 4Q illustrates an anisotropic etch of the dielectric material 420 except for that which may exist as the spacer dielectric 121 on a side of a trench. The width 132 may be a horizontal width in the trench between the spacer dielectric 121 on the sides of the trench in an embodiment. FIG. 4R illustrates a conductor 101 (i.e., 101A in the first channel 110, 101B in the second channel 120) filling the trenches. The conductor 101 may extend the height 131. The conductor 101 may extend the width 132. The finished product may be the same as FIG. 1.

FIG. 5A is a flow chart showing an operation 500 to manufacture a semiconductor device according to an embodiment. At block 501, operation 500 may include establishing (e.g., defining and etching) a signal conductor layer. The signal conductor layer established at block 501 may be multiple-patterned. For example, the signal conductor layer established at block 501 may be double-patterned. Block 501 of operation 500 may be similar to or the same as block 401 of operation 400. See FIGS. 4B-4K. At block 502, operation 500 may include determining widths of channels. Determining widths may include determining a first width of the first channel and determining a second width of the second channel. Calculating a difference in the first width and the second width may also be included at block 502. At block 503, operation 500 may include introducing (e.g., applying) a photoresist material. See FIG. 5B.

At block 504, operation 500 may include exposing the photoresist material of trenches that may not contain a spacer by applying a mask. In embodiments, the exposing may include not underexposing. In embodiments, the exposing may include overexposing where overexposing may include dimensions exposed, time, focus, etc. See FIG. 5C. At block 505, operation 500 may include developing and may include hardening undeveloped photoresist material. Hardening undeveloped photoresist material may improve adhesion of the photoresist material to the signal conductor layer. See FIG. 5D. At block 506, operation 500 may include introducing (e.g., blanket depositing) a dielectric material. See FIG. 5E. At block 507, operation 500 may include removing (e.g., anisotropically etching) dielectric material. See FIG. 5F. At block 508, operation 500 may include removing (e.g., plasma ashing) the photoresist material. See FIG. 5G. At block 509, operation 500 may include introducing (e.g., filling trenches with, polishing) a conductive material. See FIG. 5H. In addition to the described, other embodiments having fewer steps, more steps, or different steps are contemplated. Also, some embodiments may perform some or all of the steps in FIG. 5A in a different order.

Figure 5C:
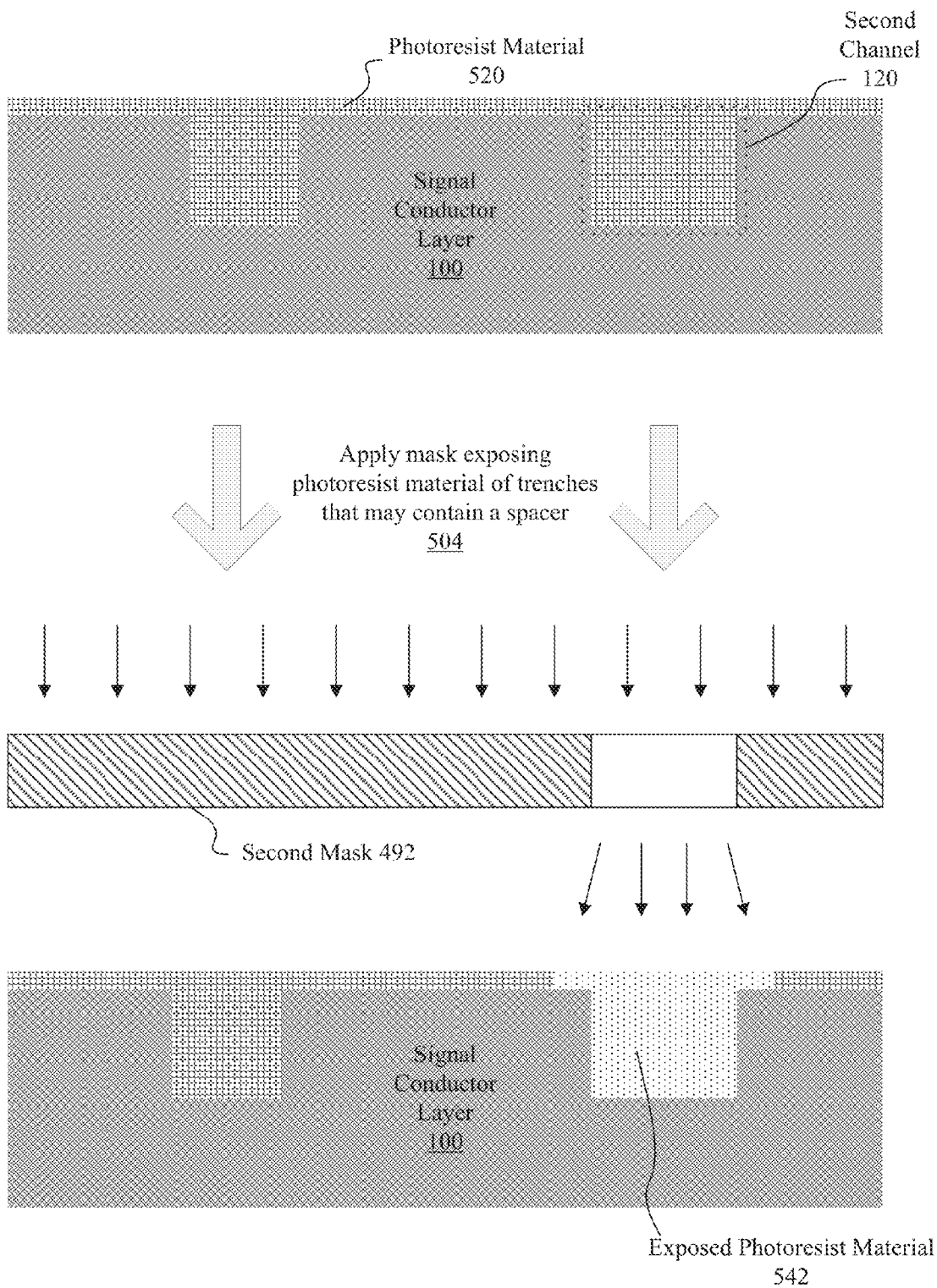
FIG. 5C illustrates an exposing of the photoresist material according to an embodiment.

FIGS. 5B-5H each illustrate a cross-sectional view of a semiconductor device according to an embodiment. FIGS. 5B-5H each illustrate a "before and after" view of operation 500 at each block of FIG. 5A according to an embodiment. Before illustration FIG. 5B, a double-patterned signal conductor layer may be established. FIGS. 4B-4K illustrate a defining and an etching of the first channel 110 and the second channel 120 in the signal conductor layer 100 which is double-patterned according to an embodiment. The first channel 110 and the second channel 120 may each have the height 131. The first channel 110 may have the width 132. The second channel 120 may have the width 133. Operations as depicted in FIG. 5B may commence thereafter.

Figure 5D:
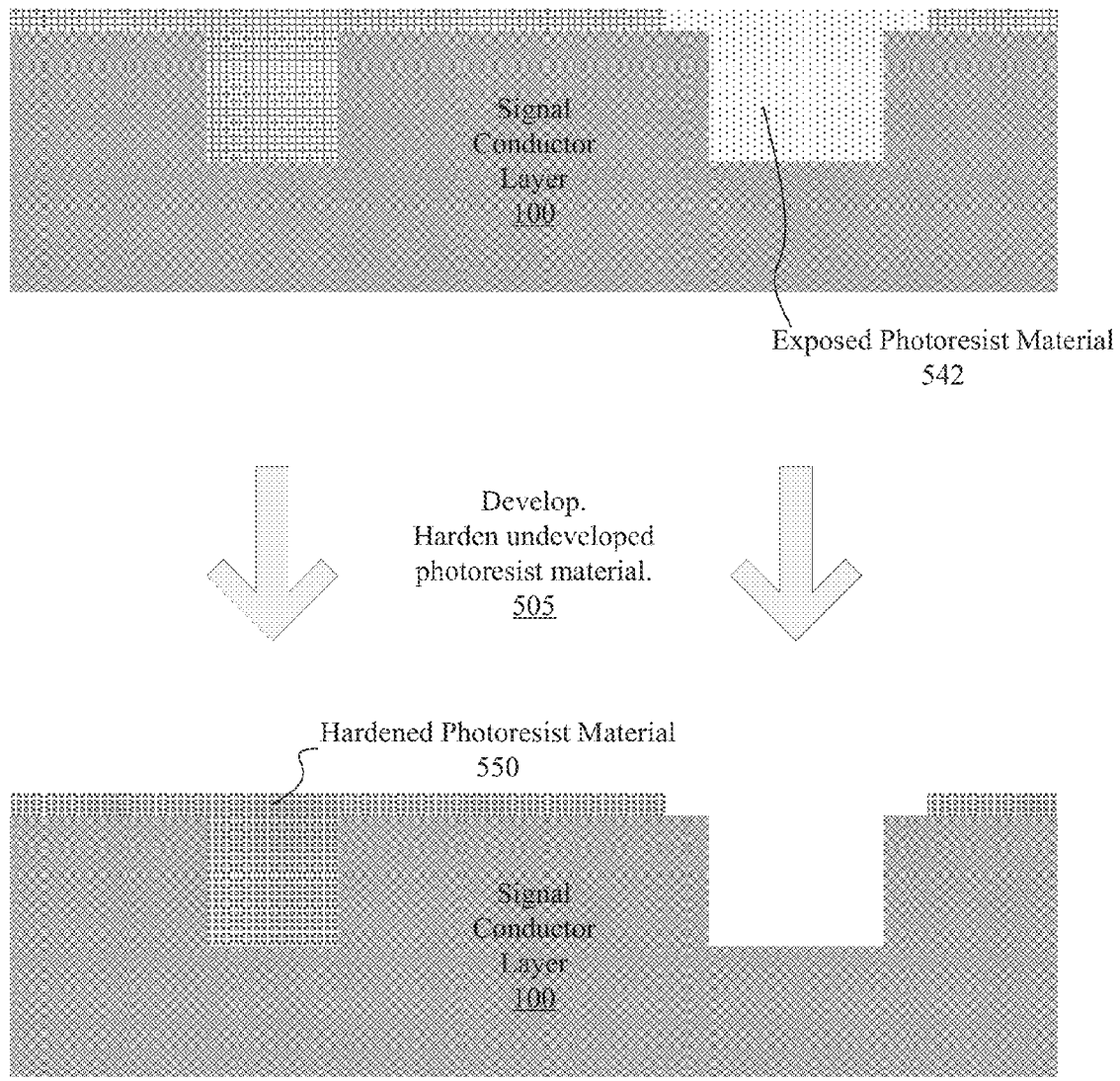
FIG. 5D illustrates a developing and a hardening of undeveloped photoresist material resulting in a hardened photoresist material according to an embodiment.

FIG. 5B illustrates determining a first width of the first channel and determining a second width of the second channel. A difference in channel widths may be calculated. FIG. 5B further illustrates an applying of a photoresist material 520 to the semiconductor device according to an embodiment. FIG. 5C illustrates an exposing of the photoresist material 520 of the second channel 120 which is a trench that may contain a spacer. The second mask 492 may be applied during a photolithographic process. After the photolithographic process, exposed photoresist material 542 may remain. FIG. 5D illustrates a developing and a hardening of undeveloped photoresist material resulting in a hardened photoresist material 550. Hardening undeveloped photoresist material may improve adhesion of the photoresist material to the signal conductor layer.

Figure 5E:
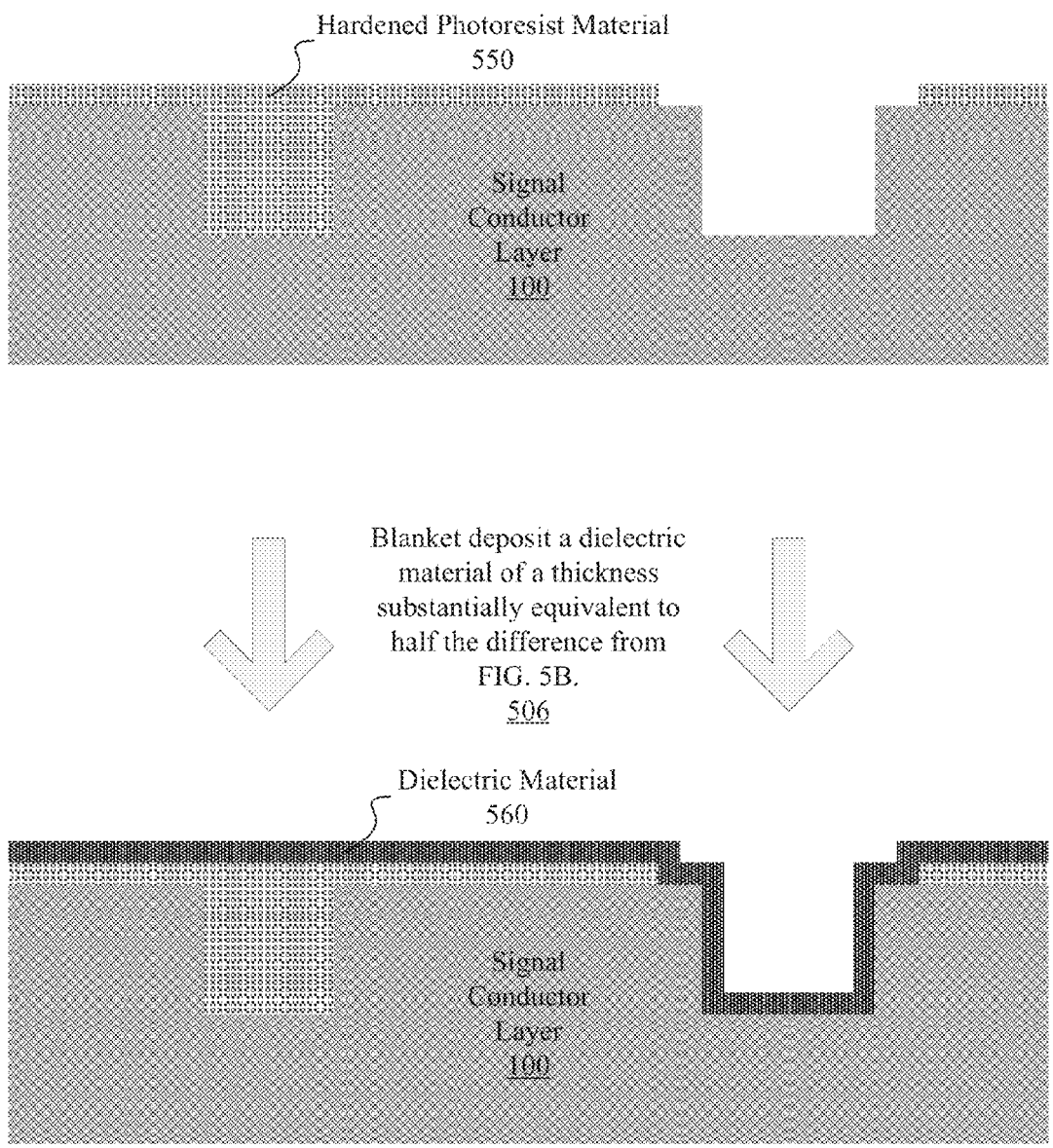
FIG. 5E illustrates a depositing of a dielectric material according to an embodiment.
Figure 5F:
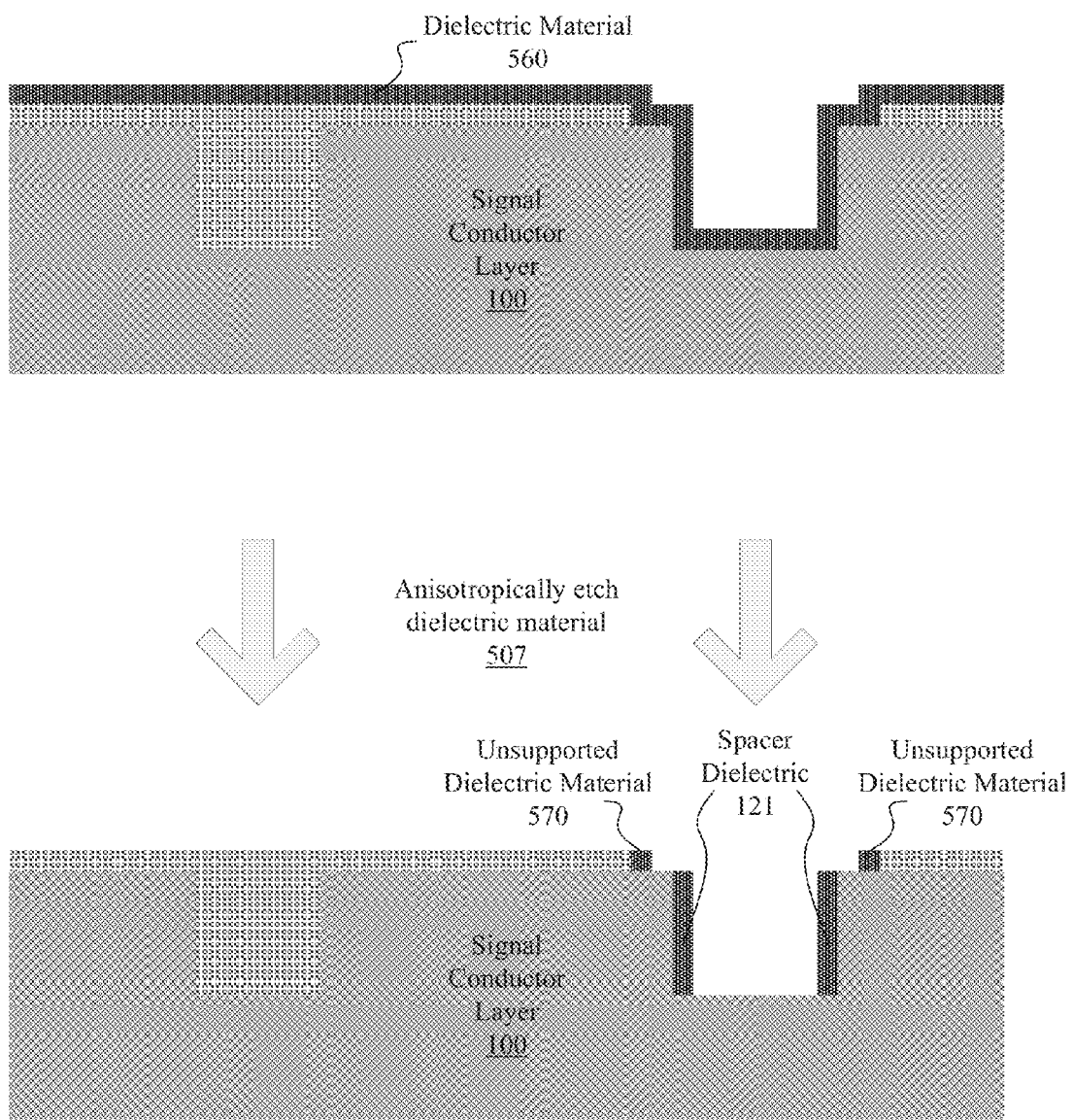
FIG. 5F illustrates anisotropically etching dielectric material according to an embodiment.
Figure 5G:
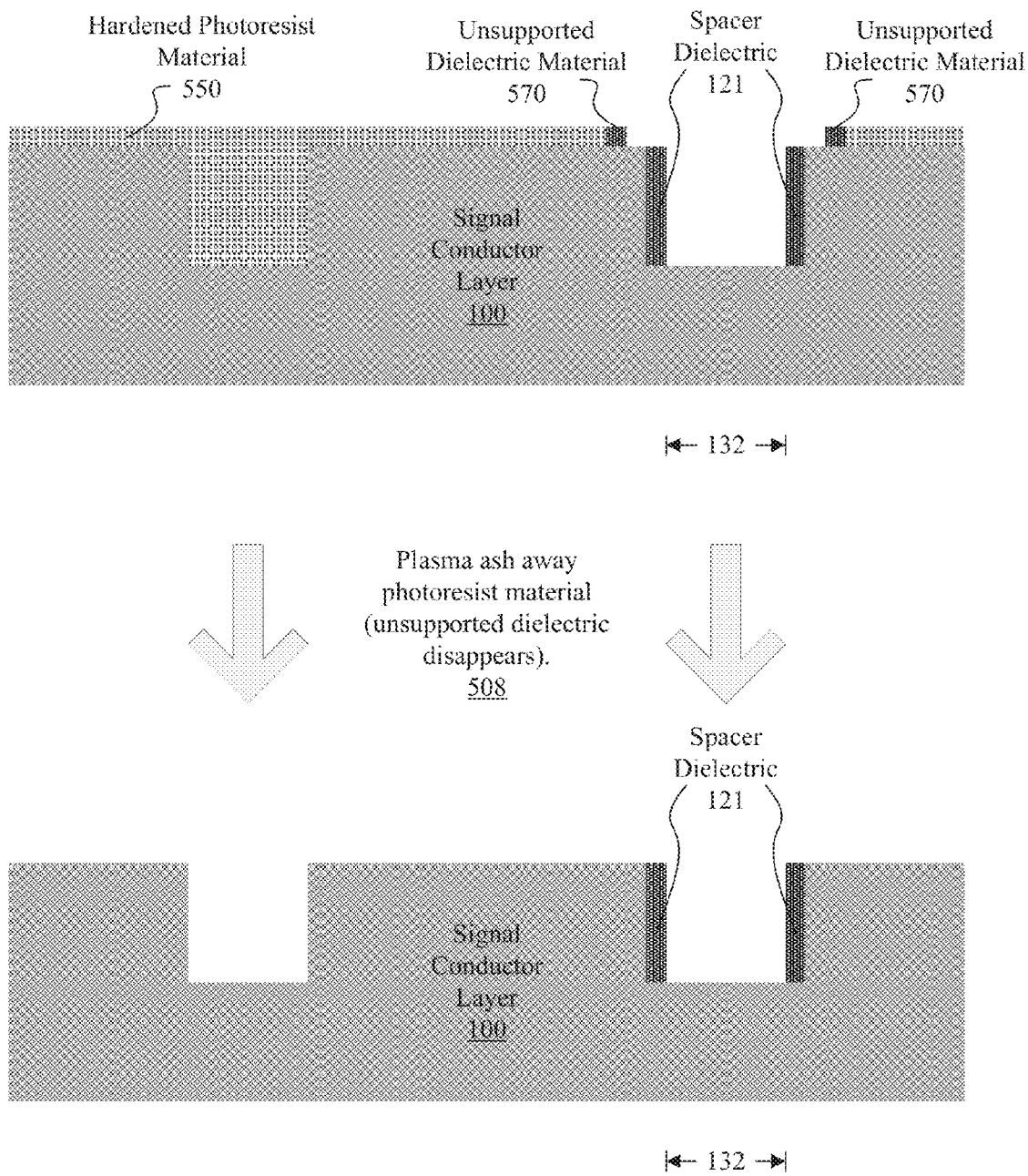
FIG. 5G illustrates a removal of the hardened photoresist material which may be completed via plasma ashing according to an embodiment.
Figure 5H:
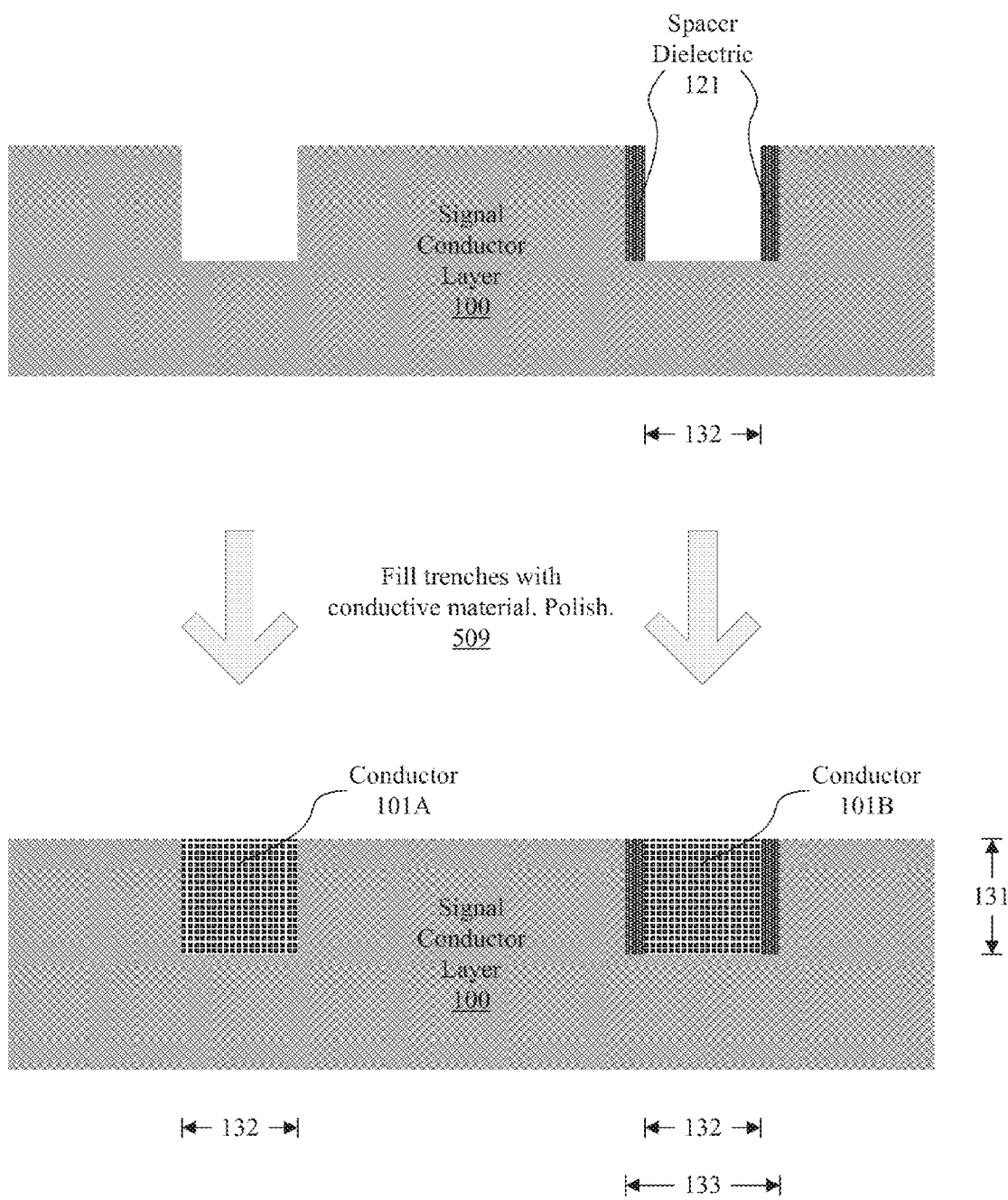
FIG. 5H illustrates a conductor filling the trenches according to an embodiment.

FIG. 5E illustrates a depositing of a dielectric material 560 to the semiconductor device according to an embodiment. The dielectric material deposited may be of a thickness substantially equivalent to half the difference calculated as shown in FIG. 5B. FIG. 5F illustrates anisotropically etching the dielectric material 560 except for that which may exist as the spacer dielectric 121 on a side of a trench and unsupported dielectric material 570. The width 132 may be a horizontal width in the trench between the spacer dielectric 121 on the sides of the trench in an embodiment. FIG. 5G illustrates a removal of the hardened photoresist material 550 which may be completed via plasma ashing. The unsupported dielectric material 570 may also disappear which may be as a result of the plasma ashing. FIG. 5H illustrates a conductor 101 (i.e., 101A in the first channel 110, 101B in the second channel 120) filling the trenches. The conductor 101 may extend the height 131. The conductor 101 may extend the width 132. The finished product may be the same as FIG. 1.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

What is claimed is:

1. A semiconductor device, comprising:
a signal conductor layer formed of an insulator, the signal conductor layer having adjacent channels for wiring tracks, the adjacent channels including:
a first channel defined by a first mask and a second channel defined by a second mask, the first channel having a first width and the second channel having a second width, the first width smaller than the second width and a channel-to-channel pitch according to 14 nm or smaller technology;
a first conductor in the first channel having a first conductor width;
a second conductor in the second channel having a second conductor width, the first conductor width substantially equivalent to the second conductor width; and
a spacer dielectric on a side of the second channel, wherein both the first conductor and the second conductor each touch the insulator, and wherein the spacer dielectric touches both the second conductor and the insulator, and wherein the first conductor is bordered on at least three edges by the insulator and the second conductor is bordered on at least one edge by the insulator, and wherein the spacer dielectric is bordered on at least two edges by the insulator.

2. The semiconductor device of claim 1, wherein the side is a vertical side.

3. The semiconductor device of claim 2, wherein the spacer dielectric has a permittivity less than 3.0.

4. The semiconductor device of claim 2, wherein the spacer dielectric has a total width substantially equivalent to a difference of the second width and the first width.

5. The semiconductor device of claim 1, wherein the first and second conductor widths and spacing between the first and second conductors are as supported in the 14 nm or smaller technology.

6. The semiconductor device of claim 1, wherein:
the first mask has a design width;
the second mask has the design width;
the first channel is processed to the first width which is a first physical width; and
the second channel is processed to the second width which is a second physical width.

7. A semiconductor device, comprising:
a signal conductor layer formed of an insulator and channels, the signal conductor layer having:
a first channel defined by a first mask and a second channel defined by a second mask, the first channel having a first width and the second channel having a second width, the first width smaller than the second width, and
the insulator bordering at least three edges of the first channel and bordering at least three edges of the second channel;
a first conductor in the first channel having a first conductor width;
a second conductor in the second channel having a second conductor width, the first conductor width substantially equivalent to the second conductor width; and
a spacer dielectric on a side of the second channel wherein portions of at least two sides of the second channel do not include the spacer dielectric, and wherein the first channel does not include the spacer dielectric.

8. The semiconductor device of claim 7, wherein:
the first mask has a design width;
the second mask has the design width;
the first channel is processed to the first width which is a first physical width; and
the second channel is processed to the second width which is a second physical width.

9. The semiconductor device of claim 7, wherein the first channel has a first wire and the second channel has a second wire.

10. The semiconductor device of claim 9, wherein at least a portion of a bottom side of the second channel is in contact with the second wire.

11. The semiconductor device of claim 7, wherein the insulator is an oxide.

12. The semiconductor device of claim 7, wherein the insulator beneath both the first channel and the second channel includes neither the first channel nor the second channel being extended fully through the insulator.

13. The semiconductor device of claim 7, wherein both the first conductor and the second conductor each touch the insulator, and wherein the spacer dielectric touches both the second conductor and the insulator.

14. The semiconductor device of claim 13, wherein the first conductor is bordered on at least three edges by the insulator and the second conductor is bordered on at least one edge by the insulator, and wherein the spacer dielectric is bordered on at least two edges by the insulator.

15. The semiconductor device of claim 14, wherein the second conductor is bordered on at least one edge by the spacer dielectric, and wherein the first conductor is not bordered on an edge by the spacer dielectric.

16. The semiconductor device of claim 15, wherein the signal conductor layer includes a channel-to-channel pitch according to 14 nm or smaller technology.

17. A semiconductor device, comprising:
a signal conductor layer formed of an insulator and adjacent channels for wiring tracks, the signal conductor layer including:

a first channel, defined by a first mask having a design width, processed to a first physical width, a second channel, defined by a second mask having the design width, processed to a second physical width, the first physical width smaller than the second physical width, and the insulator bordering at least three edges of the first channel and bordering at least three edges of the second channel;

a first conductor in the first channel having a first conductor width;

a second conductor in the second channel having a second conductor width, the first conductor width substantially equivalent to the second conductor width; and a spacer dielectric on a side of the second channel, the spacer dielectric having a total width substantially equivalent to a difference of the second physical width and the first physical width wherein portions of at least two sides of the second channel do not include the spacer dielectric, and wherein the first channel does not include the spacer dielectric.

18. The semiconductor device of claim 17, wherein the signal conductor layer includes a channel-to-channel pitch according to 14 nm or smaller technology, and wherein both the first conductor and the second conductor each touch the insulator.

* * * * *